United States Patent
Sui et al.

(10) Patent No.: US 6,813,534 B2
(45) Date of Patent: Nov. 2, 2004

(54) ENDPOINT DETECTION IN SUBSTRATE FABRICATION PROCESSES

(76) Inventors: Zhifeng Sui, 434 Alegra Ter., Milpitas, CA (US) 95035; Paul E Luscher, 1365 Flicker Way, Sunnyvale, CA (US) 94087; Nils Johansson, 16450 Kennedy Rd., Los Gatos, CA (US) 95032; Michael D Welch, 940 Roma St., Livermore, CA (US) 94550

( * ) Notice: Subject to any disclaimer, the term of this patent is extended or adjusted under 35 U.S.C. 154(b) by 177 days.

(21) Appl. No.: 10/081,088

(22) Filed: Feb. 20, 2002

(65) Prior Publication Data

US 2002/0183977 A1 Dec. 5, 2002

Related U.S. Application Data

(63) Continuation of application No. 09/350,052, filed on Jul. 8, 1999, now abandoned.
(60) Provisional application No. 60/092,426, filed on Jul. 10, 1998.

(51) Int. Cl.$^7$ .............................................. G06F 19/00
(52) U.S. Cl. ...................... 700/121; 204/192.33; 438/9; 156/345.25; 216/60
(58) Field of Search .................... 700/121; 709/227; 156/345.24, 345.25; 216/60, 61, 67, 59; 438/7, 9, 14, 16, 710, 714; 204/192.33, 298.32; 702/188

(56) References Cited

U.S. PATENT DOCUMENTS

| | | | |
|---|---|---|---|
| 3,612,692 A | 10/1971 | Kruppa et al. | 356/108 |
| 3,824,017 A | 7/1974 | Galyon | 356/108 |
| 3,874,797 A | 4/1975 | Kasai | 356/118 |
| 3,985,447 A | 10/1976 | Aspnes | 356/118 |
| 4,141,780 A | 2/1979 | Kleinknecht et al. | 156/626 |
| 4,147,435 A | 4/1979 | Habegger | 356/357 |

(List continued on next page.)

FOREIGN PATENT DOCUMENTS

| | | |
|---|---|---|
| EP | 0511448 | 4/1991 |
| EP | 0756318 | 7/1995 |
| EP | 0753912 | 7/1996 |

OTHER PUBLICATIONS

PCT Written Opinion, dated Nov. 24, 2000 for International Application No. PCT/US99/15648.

"Semi Equipment Communications Standard 1 Message Transfer (SECS–1)", SEMI E4–91, SEMI 1980, 1995, pp. 1–22.

IBM Corporation, "Method for Optical Interference Measurement and Control of Etching," *IBM Technical Disclosure Bulletin.* 34(10B), Mar. 1992, pp. 275–277.

(List continued on next page.)

*Primary Examiner*—Leo Picard
*Assistant Examiner*—Steven R. Garland
(74) *Attorney, Agent, or Firm*—Janah & Associates; Joseph Bach

(57) ABSTRACT

In an endpoint detection method for a process performed in a substrate processing chamber with an energized gas, a process variable of the process is detected. The process variable comprising at least one of (i) a radiation emitted by the energized gas, (ii) a radiation reflected from a substrate in the chamber, (iii) a reflected power level of the energized gas, and (iv) a temperature in the chamber. An endpoint signal is issued when the process variable is indicative of an endpoint of the process. A process parameter of the process is also detected, the process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position. The endpoint signal is determined to be true or false by evaluating the process parameter.

30 Claims, 9 Drawing Sheets

U.S. PATENT DOCUMENTS

| | | | | |
|---|---|---|---|---|
| 4,198,261 | A | 4/1980 | Busta et al. | 156/626 |
| 4,208,240 | A | 6/1980 | Latos | 156/627 |
| 4,317,698 | A | 3/1982 | Christol et al. | 156/626 |
| 4,328,068 | A | 5/1982 | Curtis | 156/626 |
| 4,367,044 | A | 1/1983 | Booth, Jr. et al. | 356/357 |
| 4,454,001 | A | 6/1984 | Sternheim et al. | 156/626 |
| 4,479,848 | A | 10/1984 | Otsubo et al. | 156/626 |
| 4,611,919 | A | 9/1986 | Brooks, Jr. et al. | 356/357 |
| 4,618,262 | A | 10/1986 | Maydan et al. | 356/357 |
| 4,660,979 | A | 4/1987 | Muething | 356/357 |
| 4,661,196 | A | 4/1987 | Hockersmith et al. | 156/345 |
| 4,680,084 | A | 7/1987 | Heimann et al. | 156/626 |
| 4,838,694 | A | 6/1989 | Betz et al. | 356/357 |
| 4,842,683 | A | 6/1989 | Cheng et al. | 156/345 |
| 4,846,928 | A | 7/1989 | Dolins et al. | 156/626 |
| 4,847,792 | A | 7/1989 | Barna et al. | 364/552 |
| 4,861,419 | A | 8/1989 | Flinchnaugh et al. | 156/626 |
| 4,891,087 | A | 1/1990 | Davis et al. | 156/345 |
| 4,927,485 | A | 5/1990 | Cheng et al. | 156/345 |
| 4,953,982 | A | 9/1990 | Ebbing et al. | 356/357 |
| 4,972,072 | A | 11/1990 | Hauser et al. | 250/225 |
| 5,002,631 | A | 3/1991 | Giapis et al. | 156/643 |
| 5,019,769 | A | 5/1991 | Levinson | 372/31 |
| 5,131,752 | A | 7/1992 | Yu et al. | 356/369 |
| 5,151,584 | A | 9/1992 | Ebbing et al. | 250/201.4 |
| 5,260,772 | A | 11/1993 | Pollak et al. | 356/417 |
| 5,270,797 | A | 12/1993 | Pollak et al. | 356/417 |
| 5,292,605 | A | 3/1994 | Thomson | 430/30 |
| 5,298,110 | A | 3/1994 | Schoenborn et al. | 156/626 |
| 5,320,880 | A | 6/1994 | Sandhu et al. | 427/578 |
| 5,362,356 | A | 11/1994 | Schoenborn | 156/626 |
| 5,362,969 | A | 11/1994 | Glenn | 250/561 |
| 5,374,327 | A | 12/1994 | Imahashi et al. | 156/626 |
| 5,397,433 | A | 3/1995 | Gabriel | 156/645 |
| 5,406,080 | A | 4/1995 | Friedhelm | 250/309 |
| 5,427,878 | A | 6/1995 | Corliss | 430/30 |
| 5,444,637 | A | 8/1995 | Smesny et al. | 364/557 |
| 5,450,205 | A | 9/1995 | Sawin et al. | 356/382 |
| 5,467,013 | A | 11/1995 | Williams et al. | 324/157 |
| 5,467,883 | A | 11/1995 | Frye et al. | 216/60 |
| 5,485,271 | A | 1/1996 | Drevillon et al. | 356/345 |
| 5,497,331 | A | 3/1996 | Iriki | 364/468 |
| 5,499,733 | A | 3/1996 | Litvak | 216/38 |
| 5,503,707 | A | 4/1996 | Maung et al. | 156/626.1 |
| 5,536,359 | A | 7/1996 | Kawada et al. | 156/626.1 |
| 5,552,016 | A | 9/1996 | Ghanayem | 156/627.1 |
| 5,564,830 | A | 10/1996 | Bobel et al. | 374/126 |
| 5,567,267 | A | 10/1996 | Kazama et al. | 156/345 |
| 5,597,237 | A | 1/1997 | Stein | 374/9 |
| 5,608,526 | A | 3/1997 | Piwonka-Corle et al. | 356/369 |
| 5,635,409 | A | 6/1997 | Moslehi | 438/7 |
| 5,654,903 | A | 8/1997 | Reitman et al. | 364/551.01 |
| 5,658,418 | A | 8/1997 | Coronel et al. | 156/345 |
| 5,691,540 | A | 11/1997 | Halle et al. | 250/372 |
| 5,719,495 | A | 2/1998 | Moslehi et al. | 324/158.1 |
| 5,739,051 | A | 4/1998 | Saito | 438/16 |
| 5,756,400 | A | 5/1998 | Ye et al. | 438/710 |
| 5,885,402 | A | 3/1999 | Esquibel | 156/345 |
| 5,910,011 | A | 6/1999 | Cruse | 438/16 |
| 5,918,019 | A | 6/1999 | Valencia | 709/227 |
| 6,071,818 | A | 6/2000 | Chisolm et al. | 438/692 |
| 6,153,115 | A | 11/2000 | Le et al. | 216/60 |
| 6,157,447 | A | 12/2000 | Smith, Jr. et al. | 356/316 |
| 6,165,311 | A | 12/2000 | Collins et al. | 156/345 |
| 6,269,279 | B1 | 7/2001 | Todate et al. | 700/121 |

OTHER PUBLICATIONS

Haverlag, M. and Oehrlein, G.S., "In situ Ellipsometry and Reflectrometry During Etching of Patterned Surfaces: Experiments and Simulations" J. Vac. Sci. Technol. B 10(6) Nov./Dec. 1992, pp. 2412–2418.

Klemans, F.P., et al., "High Density Plasma Gate Etching of 0.12 μm Devices with Sub 1.5 nm Gate–Oxides," Electrochemical Society Proceedings, vol. 97–30, pp. 85–95.

Maynard, et al., "Multiwavelength Ellipsometry for Real–time Process Control of the Plasma Etching of Patterned Samples," J. Vac. Sci. Technol. B, 15(1), Jan./Feb. 1997, pp. 109–115.

U.S. patent application Entitled, "Closed–Loop Dome Thermal control Apparatus for a Semiconductor Wafer Processing System"; filed Dec. 16, 1996; Ser. No. 08/767,071, Inventors: Yavelberg et al.

ENDPOINT DETECTION IN SUBSTRATE FABRICATION PROCESSES

CROSS-REFERENCE

This application is a continuation of U.S. patent application Ser. No. 09/350,052, filed on Jul. 8, 1999, now abandoned, entitled "ENDPOINT DETECTION FOR SUBSTRATE FABRICATION PROCESS" which claims the benefit of U.S. Provisional Application No. 60/092,426 filed on Jul. 10, 1998, both of which are incorporated herein by reference.

BACKGROUND

The present invention relates to the detection of an endpoint of a process being performed on a substrate.

In substrate fabrication processes, semiconductor, dielectric, and conductor materials, such as for example, polysilicon, silicon dioxide, and aluminum layers are deposited on a substrate and etched to form patterns of gates, vias, contact holes or interconnect lines. The layers are typically formed by chemical vapor deposition (CVD), physical vapor deposition, or oxidation and nitridation processes. For example, in CVD processes, a reactive gas is decomposed to deposit a layer of material on the substrate and in PVD processes, a target is sputtered to deposit material on the substrate. In oxidation and nitridation processes, a layer of oxide or nitride, typically silicon dioxide or silicon nitride is formed on the substrate. In etching processes, a patterned mask layer of photoresist or hard mask is formed on the substrate by photolithographic methods, and the exposed portions of the substrate are etched by an energized gases, such as $Cl_2$, HBr or $BCl_3$.

In these processes, it is often desirable to stop processing of the substrate at a predetermined stage. For example, in conventional etching processes it is difficult to stop the etch process after etching only a thin layer of the substrate. As an example, in the etching of gate structures, it is desirable after etching for the remaining thickness of an underlying gate oxide layer to be close as possible to a predetermined and acceptable value so that the etching process does not damage any underlying polysilicon or silicon. The gate oxide layer is becoming thinner and thinner in the fabrication of high speed integrated circuits, making it more difficult to accurately etch through an overlying polysilicon layer without overetching into the underlying gate oxide layer. As another example, it is often desirable to form a layer having a controlled and predetermined thickness in deposition, oxidation and nitridation processes, and stop the process precisely when the desired thickness of layer is obtained.

Endpoint detection methods are used to measure the endpoint of the etching, deposition, oxidation or nitridation process. Endpoint measurement techniques include for example, plasma emission analysis in which an emission spectra of a plasma formed in the chamber is analyzed to determine a change in chemical composition that corresponds to a change in composition of the layer being etched, as taught in U.S. Pat. No. 4,328,068 which is incorporated herein by reference. As another example, U.S. Pat. No. 5,362,256 which is also incorporated herein by reference, discloses a method of monitoring etching or deposition progress by monitoring a plasma emission intensity at a selected wavelength and correlating variations in the plasma emission intensity with remaining film thickness, etch rate, etch uniformity and etch endpoint.

Another endpoint detection system useful for measuring a process endpoint before processing of an entire layer is completed is ellipsometry. In this method, a polarized light beam is reflected off the surface of a layer being etched and is analyzed to determine a phase shift and a change in magnitude of the reflected light that occurs upon etching through the layer, as for example disclosed in U.S. Pat. Nos. 3,874,797 and 3,824,017, both of which are incorporated herein by reference. Polarized light filters are used to measure the change in phase of the polarized light beam that is reflected from the surface of the substrate.

Interferometry is yet another endpoint detection method. An exemplary method is disclosed in U.S. Pat. No. 4,618,262 to Maydan et al, which is also incorporated herein by reference, and which discloses a laser interferometer system in which a laser beam is directed onto a layer being processed on a substrate. The laser and associated monitoring system provide a measured reflectance curve as the layer is being processed. A computer determines when a preselected etching depth has been reached by counting the number of maxima or minima of the reflectance signal to determine or by recognizing the end of the etching process based on cessation of a signal.

In yet another endpoint detection method, U.S. Pat. No. 5,846,882 to Birang discloses a method of detecting polishing endpoint in a chemical and mechanical polishing process. A monitor measures the power output to a monitor and generates an output signal representing the power input. An accumulator receives the output signal and a sum of the output signal is compared to a predetermined sum to indicate when an endpoint has been reached.

Each of these systems, especially the plasma emission analysis devices, suffer in that they sometimes provide positive indication that an endpoint has occurred, when in actuality endpoint has not yet occurred. The occurrence of such false endpoint signals or calls reduce the accuracy of the etching process and substrate yields are diminished. There is, therefore, a need to reduce the number of, or entirely eliminate, erroneous endpoint signals in the conventional endpoint detection methods such as those described herein. It is further desirable to have an endpoint detection method that accurately terminates a substrate fabrication process as soon as the desired thickness of a layer being processed on the substrate is achieved, and without damaging any underlying layers.

It is also desirable for data from the endpoint detection process or other data, such as process control data, to be accessible to multiple users without tying up, slowing down, or otherwise causing errors in the operation of the process chamber or its endpoint detection system.

SUMMARY

An endpoint detection method for a process performed in a substrate processing chamber with an energized gas, the method comprising:

(a) detecting a process variable of the process, the process variable comprising at least one of (i) a radiation emitted by the energized gas, (ii) a radiation reflected from a substrate in the chamber, (iii) a reflected power level of the energized gas, and (iv) a temperature in the chamber;

(b) issuing an endpoint signal when the process variable is indicative of an endpoint of the process;

(c) detecting a process parameter of the process, the process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position; and (d) determining if the endpoint signal is true or false by evaluating the process parameter.

An endpoint detection method for a process performed in a substrate processing chamber with an energized gas, the method comprising:

(a) detecting a process variable of the process, the process variable comprising at least one of (i) a radiation emitted by the energized gas, (ii) a radiation reflected from a substrate in the chamber, (iii) a reflected power level of the energized gas, and (iv) a temperature in the chamber;

(b) issuing an endpoint signal when the process variable is indicative of an endpoint of the process; and (c) detecting a process parameter of the process, the process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position;

(d) evaluating the process parameter to set a fault flag if the process parameter is not a predetermined value or is not in a range of predetermined values; and (e) determining the endpoint signal to be (i) false if the endpoint signal is issued and the fault flag is set, or (ii) true if the endpoint signal is issued and the fault flag is not set.

An endpoint detection method for a process performed in a substrate processing chamber with an energized gas, the method comprising:

(a) detecting an intensity of (i) a radiation from the energized gas, or (ii) a radiation reflected from a substrate in the chamber;

(b) determining if the intensity of the radiation corresponds to a first value or is in a first range of values;

(c) detecting a process parameter of the process performed in the chamber;

(d) determining if the process parameter is in a second range of values corresponding to a response coefficient in the equation:

$$\frac{\Delta I(\lambda)}{I(\lambda)} = A_R \frac{\Delta R}{R} + A_P \frac{\Delta P}{P} + A_{F1} \frac{\Delta F_1}{F_1} + A_{F2} \frac{\Delta F_2}{F_2} + A_{F3} \frac{\Delta F_3}{F_3},$$

where R is an RF power applied to the energized gas, P is a pressure of the gas in the chamber, F1, F2, and F3 are gas flow rates, and AR, AP, AF1, AF2, and AF3 are their respective response coefficients; and (e) determining if an endpoint of the process is reached when the radiation intensity is in the first range of values and the process parameter is in the second range of values.

An endpoint detection apparatus for detecting an endpoint of a process performed in a substrate processing chamber with an energized gas, the apparatus comprising:

(a) one or more detectors to detect:
  (1) a process variable of the process, the process variable comprising at least one of (i) a radiation emitted by the energized gas, (ii) a radiation reflected from a substrate in the chamber, (ii) a reflected power level of the energized gas, and (iv) a temperature in the chamber; and
  (2) a process parameter of the process, the process parameter comprising at least one of (i) a source power, (ii) an RF forward power, reflected power, or match components, (iii) an RF peak-to-peak voltage, current or phase, (iv) a DC bias level, (v) a gas pressure or throttle valve position, (vi) a gas composition or flow rate, (vii) a substrate temperature or composition, (viii) a temperature of a chamber component or wall, and (ix) a magnetic confinement level or magnet position; and (b) a controller adapted to:
  (1) issue an endpoint signal when the process variable is indicative of an endpoint of the process; and
  (2) determine if the endpoint signal is true or false by evaluating the process parameter.

An endpoint detection apparatus for detecting an endpoint of a process performed in a substrate processing chamber with an energized gas, the apparatus comprising:

(a) one or more detectors to detect:
  (1) a process variable of the process, the process variable comprising at least one of (i) a radiation emitted by the energized gas, (ii) a radiation reflected from a substrate in the chamber, (ii) a reflected power level of the energized gas, and (iv) a temperature in the chamber, and
  (2) a process parameter of the process, the process parameter comprising at least one of (i) a source power, (ii) an RF forward power, reflected power, or match components, (iii) an RF peak-to-peak voltage, current or phase, (iv) a DC bias level, (v) a gas pressure or throttle valve position, (vi) a gas composition or flow rate, (vii) a substrate temperature or composition, (viii) a temperature of a chamber component or wall, and (ix) a magnetic confinement level or magnet position; and (b) a controller adapted to:
  (1) issue an endpoint signal when the process variable is indicative of an endpoint of the process,
  (2) evaluate the process parameter to set a fault flag if the process parameter does not correspond to a predetermined value or is in a range of predetermined values, and
  (3) determine the endpoint signal to be (i) false if the endpoint signal is issued and the fault flag is set, or (ii) true if the endpoint signal is issued and the fault flag is not set.

An endpoint detection apparatus for detecting an endpoint of a process performed in a substrate processing chamber with an energized gas, the apparatus comprising:

(a) one or more detectors to detect:
  (1) an intensity of (i) a radiation from the energized gas, or (ii) a radiation reflected from a substrate in the chamber, and
  (2) a process parameter of the process performed in the chamber; and (b) a controller adapted to:
  (1) determine if the intensity of the radiation corresponds to a first value or is in a first range of values, (2) determine if the process parameter is in a second range of values corresponding to a response coefficient in the equation:

$$\frac{\Delta I(\lambda)}{I(\lambda)} = A_R \frac{\Delta R}{R} + A_P \frac{\Delta P}{P} + A_{F1} \frac{\Delta F_1}{F_1} + A_{F2} \frac{\Delta F_2}{F_2} + A_{F3} \frac{\Delta F_3}{F_3},$$

where R is an RF power applied to the energized gas, P is a pressure of the gas in the chamber, F1, F2, and F3 are gas flow rates, and AR, AP, AF1, AF2, and AF3 are their respective response coefficients, and (3) determine if an endpoint of the process is reached when the radiation intensity is the first value or is in the first range of values, and the process condition is in the second range of values.

DRAWINGS

These and other features, aspects, and advantages of the present invention will be better understood from the following drawings, description and appended claims, which illustrate examples of the invention.

DESCRIPTION

The present invention relates to a process chamber and endpoint detection apparatus and a method that can reduce the rate and number of erroneous or otherwise false signals or calls that are obtained in the termination or alteration of processing of a substrate. The following description and accompanying drawings represent illustrative embodiments of the invention and are not intended to limit the invention. Thus, while the description and drawings illustrate exemplary features of the invention, it is to be understood that each of the features can be used in the invention in general, not merely in the context of the particular drawings, and the invention includes any combination of these features.

Figure 1A:
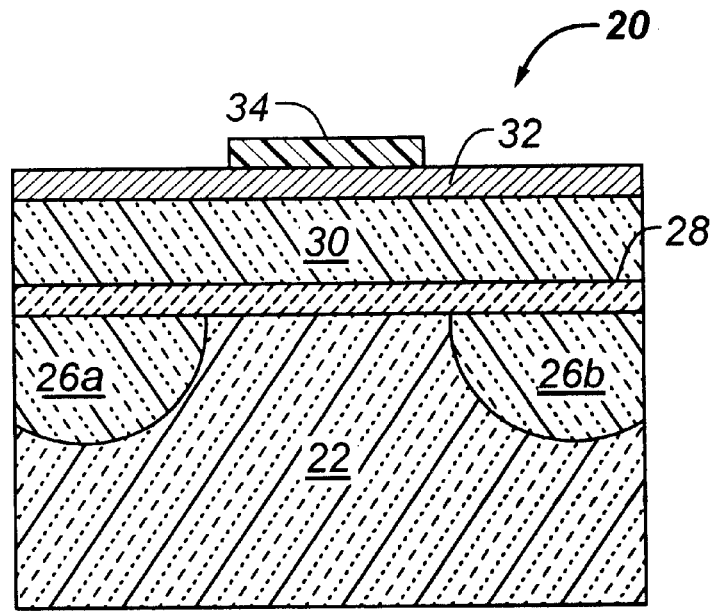
FIGS. 1a and 1b are schematic sectional side views of a typical structure of a substrate before and after etching according to the present invention.
Figure 1B:
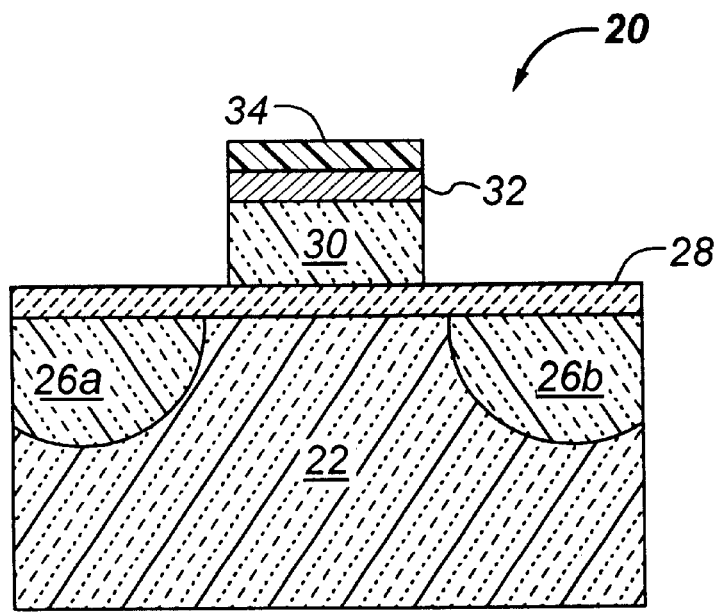

The substrate processing and endpoint detection system of the present invention is useful for fabricating integrated circuits on semiconductor substrates and is particularly useful for etching semiconductor, dielectric, or conductor layers, especially layers comprising silicon-containing material that may be elemental silicon or silicon compounds. Such layers are often superimposed on one another making it difficult to etch through a thicker overlying silicon-containing layer and stop the etching process without etching through a thinner underlying silicon-containing layer. Dielectric layers include, for example, silicon dioxide, undoped silicate glass, phosphosilicate glass (PSG), borophosphosilicate glass (BPSG), $Si_3N_4$, or TEOS deposited glass; semiconducting layers include, for example, polysilicon or silicon, and metal-containing layers include aluminum, copper, tungsten silicide and cobalt silicide. FIGS. 1a and 1b show an exemplary structure of a substrate 20 that may be etched using the present process. By "substrate" it is meant the entire structure including the support structure and overlying layers. For example, the substrate 20 may comprise a silicon wafer 22 having doped silicon regions 26a, 26b and an overlying relatively thin silicon dioxide (gate oxide) layer 28 having a thickness of from about 10 to about 300 Å. A polysilicon layer 30 and a TiN anti-reflective layer 32 are deposited over the gate oxide layer 28. Patterned resist features 34 comprising photoresist and/or hard mask (typically silicon oxide or silicon nitride) are formed by conventional photolithographic methods to expose portions of the substrate 20 for etching. While the process of the present invention is illustrated by way of etching an exemplary silicon-containing layer in the fabrication of a semiconductor device, the present invention can be used in other processes such as chemical vapor deposition (CVD), physical vapor deposition (PVD), oxidation, nitridation and evaporation, and should not be limited to the examples provided herein.

Figure 2:
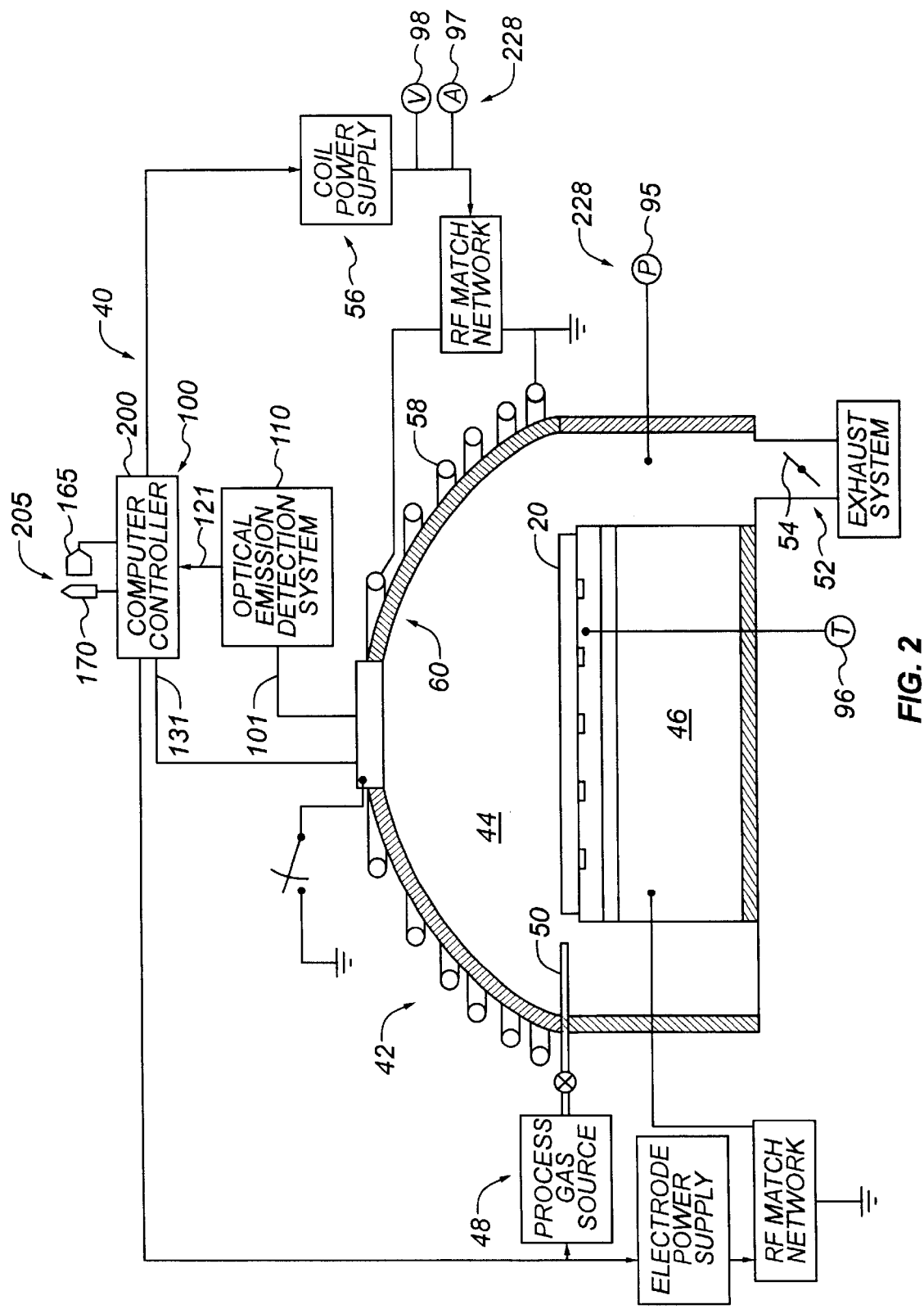
FIG. 2 is a schematic sectional side view of a chamber and endpoint detection system according to the present invention.

The substrate 20 is etched in a semiconductor processing apparatus 40, schematically illustrated in FIG. 2, commercially available from Applied Materials Inc., Santa Clara, Calif., suitable process chambers being described in U.S. patent application Ser. Nos. 08/767,071, now abandoned, and 08/597,445, now U.S. Pat. No. 5,777,289, both of which are incorporated herein by reference. The apparatus 40 comprises a process chamber 42 having a process zone 44 for processing the substrate 20, and a support 46 such as an electrostatic chuck that holds the substrate in the process zone. The ceiling 60 of the process chamber 42 can be flat or rectangular shaped, arcuate, conical, dome-shaped, or multi-radius dome-shaped. Process gas is introduced into the chamber 42 through a gas distribution system 48 that includes a process gas supply and a gas flow control system that comprises a gas flow control valve. The gas distribution system 48 can comprise gas outlets 50 located at or around the periphery of the substrate 20 (as shown), or a showerhead mounted on the ceiling of the chamber 42 with outlets therein (not shown). Spent process gas and etchant byproducts are exhausted from the process chamber 42 through an exhaust system (typically including a 1000 liter/sec roughing pump and a 1000 to 2000 liter/sec turbomolecular pump) capable of achieving a minimum pressure of about $10^{-3}$ mTorr in the chamber 42. A throttle valve 54 is provided in the exhaust system 52 to control the flow of spent process gas and the pressure of process gas in the chamber 42.

A plasma is generated from the process gas by a plasma generator 56 that couples electromagnetic energy to the gas in the process zone 44 of the chamber 42 (as shown) or in a remote zone adjacent to the process chamber (not shown). The remote zone is typically in a remote chamber (also not shown) that is upstream of the chamber 42. The plasma generator 56 is, for example, an inductor antenna 58 comprising inductor coils having a circular symmetry with a central axis coincident with the longitudinal vertical axis that extends through the center of the chamber 42 and is perpendicular to a plane of the substrate 20, as for example, described in U.S. patent application Ser. No. 08/648,254, now U.S. Pat. No. 6,165,311, which is incorporated herein by reference. When the inductor antenna 58 is positioned near the ceiling, the ceiling of the chamber 42 comprises dielectric material, such as aluminum oxide, which is transparent to electromagnetic fields and is also an electrical insulator material. The frequency of the RF voltage applied to the inductor antenna 58 is typically about 50 KHz to about 60 MHz, and more typically about 13.56 MHz; and the power level of RF voltage applied to the antenna is about 100 to about 5000 Watts. In addition to the inductor antenna 58, one or more process electrodes (not shown) can be used to accelerate or energize the plasma ions in the chamber 42. The process electrodes typically include a conducting portion of the support 46 that is electrically biased relative to a portion of a wall of the chamber 42 which is electrically grounded. The electrodes capacitively couple with one another to form a capacitive electromagnetic field that generates or energizes the gas in the chamber.

The chamber 42 further comprises one or more detectors or sensors 228 that are used to detect, monitor continuously during an operation of the chamber 42, or monitor during a process being conducted on the substrate 20—the process conditions in the chamber 42. The detectors include, for example, but are not limited to, a radiation sensing device such as a photomultiplier or optical detection system 110; a gas pressure sensing device such as a pressure gauge 95, for example, a manometer; a temperature sensing device 96 such as a thermocouple or RTD; ammeters 97 and voltmeters 98 to measure the currents and voltages applied to the chamber components; or any other device capable of measuring a process condition in the chamber 42 and providing an output signal, such as an electrical signal, that varies in relation to the measurable process condition.

By "process condition" it is meant any event occurring in the chamber 42, before, after or during a process being conducted in the chamber, and may include process parameters and/or process variables. By "process parameter" it is meant any parameter of a set of at least partially settable or at least partially controllable attributes of the chamber 42 or its components, whose values determine the characteristics and properties of a process being conducted in the chamber 42, including but not limited to, source power, RF power forward, RF reflected power, RF match components (such as load and tune position), RF peak-to-peak voltage and current and phase components, DC bias, chamber pressure and throttle valve positions, gas compositions and flow rates, substrate temperature and composition, chamber component or wall temperatures, magnetic confinement levels or magnet positions, and the like. By "process variable" it is meant any variable of a set of measurable values that vary in accordance with processing parameters and processing states, including but not limited to the wavelengths of radiation emitted by the energized gas or plasma in the chamber which can depend on the emission spectra of the chemical constituents in the gas, an attribute of radiation reflected from the substrate 20, such as an intensity or phase of the reflected radiation, reflected power levels of the plasma in the chamber 42, temperature in the chamber 42, or other process events. These lists are not intended to be exhaustive or exclusive.

The process conditions measured by the detectors in the chamber 42 are transmitted as electrical signals to a controller 200. Although, the controller 200 is illustrated by way of an exemplary single controller device to simplify the description of present invention, it should be understood that the controller 200 may be a plurality of controller devices that may be connected to one another or a plurality of controller devices that may be connected to different components of the chamber 42; thus, the present invention should not be limited to the illustrative and exemplary embodiments described herein.

Figure 3:
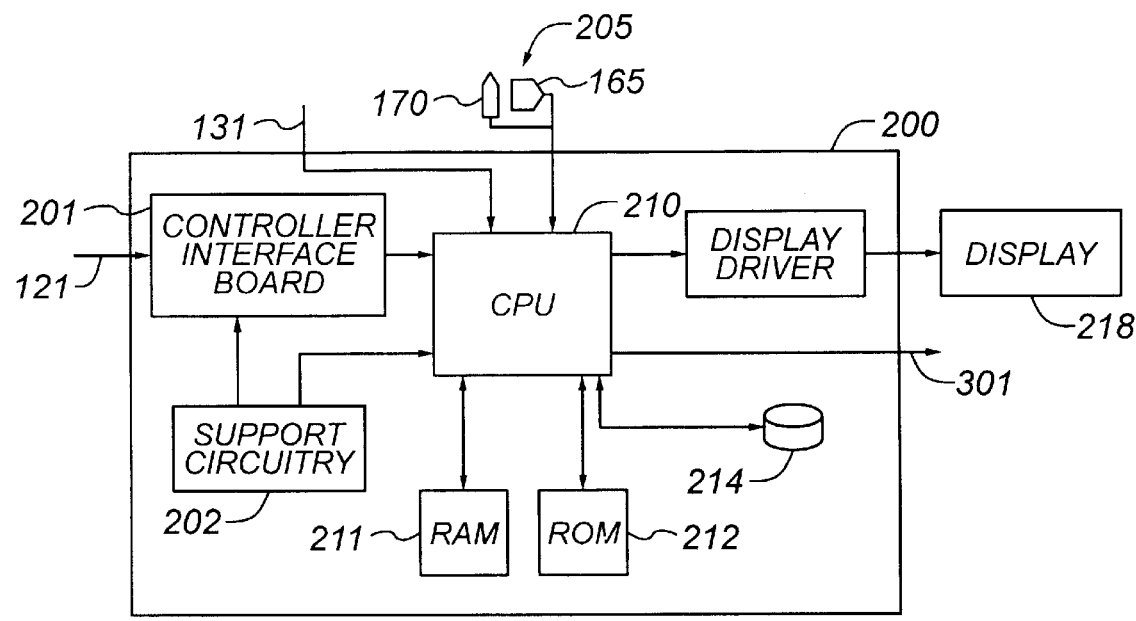
FIG. 3 is a schematic block diagram of a controller of the endpoint detection apparatus.

In one embodiment, the controller 200 comprises electronic hardware including electrical circuitry comprising integrated circuits that is suitable for operating the chamber 42 and its peripheral components, as schematically shown in the block diagram of FIG. 3. Generally, the controller 200 is adapted to accept data input, run algorithms, produce useful output signals, and may also be used to detect data signals from the detectors and other chamber components, and to monitor or control the process conditions in the chamber 42. For example, the controller 200 may comprise (i) a computer comprising a central processor unit 210 (CPU) which is interconnected to a memory system with peripheral control components, (ii) application specific integrated circuits (ASICs) that operate particular components of the chamber 42, and (iii) one or more controller interface boards 201 along with suitable support circuitry 202. Typical central CPUs 210 include the PowerPC™, Pentium™, and other such processors. The ASICs are designed and preprogrammed for particular tasks, such as retrieval of data and other information from the chamber, or operation of particular chamber components. The controller interface boards 201 are used in specific signal processing tasks, such as for example, to process a signal 121 from a process detection and monitoring system 110 and provide a data signal to the central processing unit (CPU) 210. Typical support circuitry 202 include for example, co-processors, clock circuits, cache, power supplies and other well known components that are in communication with the CPU 210. For example, the CPU 210 often operates in conjunction with a random access memory (RAM) 211, a read-only memory (ROM) 212 and other storage devices 214 well known in the art. The RAM 211 can be used to store the software implementation of the present invention during process implementation. The programs and subroutines of the present invention are typically stored in mass storage devices 214 and are recalled for temporary storage in RAM 211 when being executed by the CPU 210.

The resulting output of the CPU 210 is passed to a display driver 215 which drives a display device 218 or other communicating device. Input devices 205 allow an operator to input data into the controller 200 to control operations or to alter the software in the controller 200. For example, the interface between an operator and the computer system may be a CRT monitor 165 and a light pen 170, as shown in FIG. 2. The light pen 170 detects light emitted by the CRT monitor 165 with a light sensor in the tip of the pen 170. To select a particular screen or function, the operator touches a designated area of the CRT monitor 165 and pushes a button on the pen 170. The area touched changes its color or a new menu or screen is displayed to confirm the communication between the light pen and the CRT monitor 165. Other devices, such as a keyboard, mouse or pointing communication device can also be used to communicate with the controller 200. The CPU 210 can also generate other control signals 301 as will be described below.

The software implementation and computer program code product of the present invention may be stored in a memory device, such as a floppy disk or a hard drive, and called into RAM during execution by the controller 200. The computer program code may be written in conventional computer readable programming languages, such as for example, assembly language, C, C++, or Pascal. Suitable program code is entered into a single file, or multiple files, using a conventional text editor and stored or embodied in a computer-usable medium, such as a memory of the computer system. If the entered code text is in a high level language, the code is compiled to a compiler code which is linked with an object code of precompiled windows library routines. To execute the linked and compiled object code, the system user invokes the object code, causing the computer system to load the code in memory to perform the tasks identified in the computer program.

Figure 4:
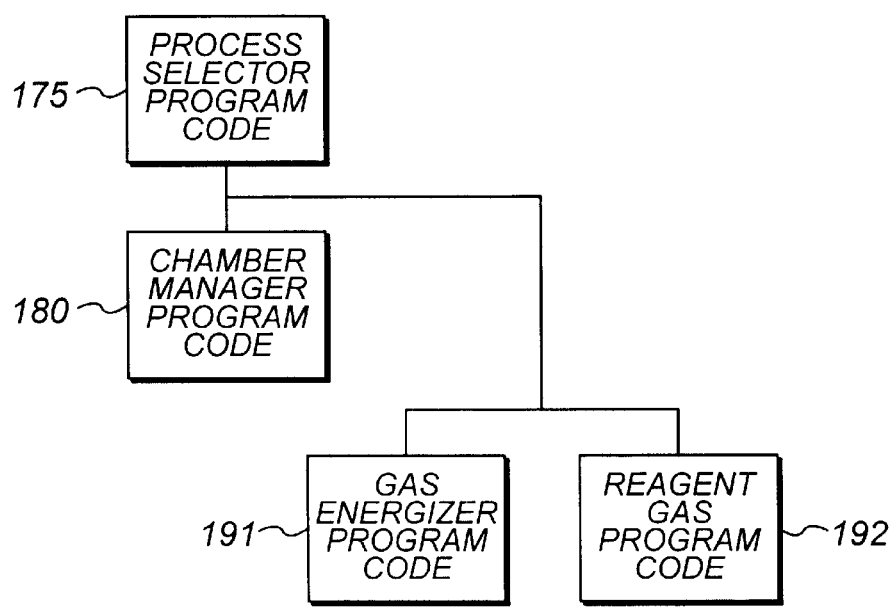
FIG. 4 is illustrative of a block diagram showing a computer program product for operating a controller according to the present invention.

Typically, the computer program code comprises one or more sets of computer instructions that dictate the timing, process gas composition, chamber pressure and temperature, RF power levels inside the chamber 42, electrode positioning, and other process parameters of the process chamber 42. The computer program instruction also controls settings for power levels of the energy coupled to the plasma generator, the flow levels and composition of gas introduced into the chamber 42, and the signal and display devices. A preferred version of the computer program code, as illustrated in FIG. 4, comprises multiple sets of program code instructions, such as a process selector and sequencer program code 175 that allows an operator to enter and select a process recipe, and that executes operation of the process recipe in a selected process chamber 42 and chamber manager program code 180 for operating and managing priorities of the chamber components in the process chamber 42. While illustrated as separate program codes that perform a set of tasks, it should be understood that these program codes can be integrated, or the tasks of one program code integrated with the tasks of another program code to provide a desired set of tasks. Thus the controller 200 and program code described herein should not be limited to the specific embodiment of the program codes described herein or housed as shown herein, and other sets of program code or computer instructions that perform equivalent functions are within the scope of the present invention.

In operation, a user enters a process set and process chamber number into the process selector program code 175 via the video interface terminal 165. The process sets are composed of process parameters necessary to carry out a specific process in the chamber 42, and are identified by predefined set numbers. The process selector program code 175 identifies a desired process chamber, and the desired set of process parameters needed to operate the process chamber for performing a particular process. The process parameters include process conditions, such as for example, process gas composition and flow rates, chamber temperature and pressure, plasma parameters such as microwave or RF bias power levels and magnetic field power levels, cooling gas pressure, and chamber wall temperature.

The process selector program code 175 executes the process set by passing the particular process set parameters to the chamber manager program code 180 which control multiple processing tasks in different process chambers according to the process set determined by the process selector program code 175. For example, the chamber manager program code 180 comprises program code for etching a substrate 20 or depositing material on a substrate in the chamber 42. The chamber manager program code 180 controls execution of various chamber component program code instructions sets which control operation of the chamber components. Examples of chamber component control program code include substrate positioning instructions sets that control robot components that load and remove the substrate 20 onto the support 46, process gas control instruction sets that control the composition and flow rates of process gas supplied into the chamber 42, pressure control instruction sets that set the size of the opening of the throttle valve 54, and plasma control instruction sets that control the power level of the plasma generator 56. In operation, the chamber manager program code 180 selectively calls the chamber component instruction sets in accordance with the particular process set being executed, schedules the chamber component instruction sets, monitors operation of the various chamber components, determines which component needs to be operated based on the process parameters for the process set to be executed, and causes execution of a chamber component instruction set responsive to the monitoring and determining steps. The plasma generator program code 191 includes a program code instruction sets for adjusting levels of the source or bias power applied to operate the plasma generator 56. The gas program code 192 includes program code instruction sets for controlling the gas composition and flow levels passed through the chamber by adjusting the opening of one or more gas valves. FIG. 4 merely shows examples of a program code configuration.

The apparatus 40 further comprises an endpoint detection system 100 for detecting an endpoint of a process being performed in the chamber, which operates in conjunction with and at least partially resides on the computer system. Generally, the endpoint detection system 100 comprises one or more detectors 228 to detect and monitor the process variables of the process being conducted in the process chamber 42 and optionally, to also analyze the information collected to determine the stage of processing. The endpoint detection system 100 includes an plasma emission monitoring system 110 and a computer, preferably the controller 200. The monitoring system 110 is connected to the process chamber 42 by a conventional fiber optic cable 101 capable of transmitting intensity data from radiation such as light being emitted or emanating from the energized gas in the process chamber 42. For example, optical emission detection for endpoint determination is discussed in Chapter 16, of *Silicon Processing for the VLSI Era, Volume 1: Process Technology*, by Stanley Wolf et al., Lattice Press (1986), which is incorporated herein by reference. An example of an endpoint detection method is disclosed in commonly-owned and assigned U.S. patent application Ser. No. 08/854,508, filed on May 12, 1997, now U.S. Pat. No. 5,910,011, and entitled "Method and Apparatus for Monitoring Process Using Multiple Parameters of a Semiconductor Wafer Processing System," which is also incorporated herein by reference.

Figure 5:
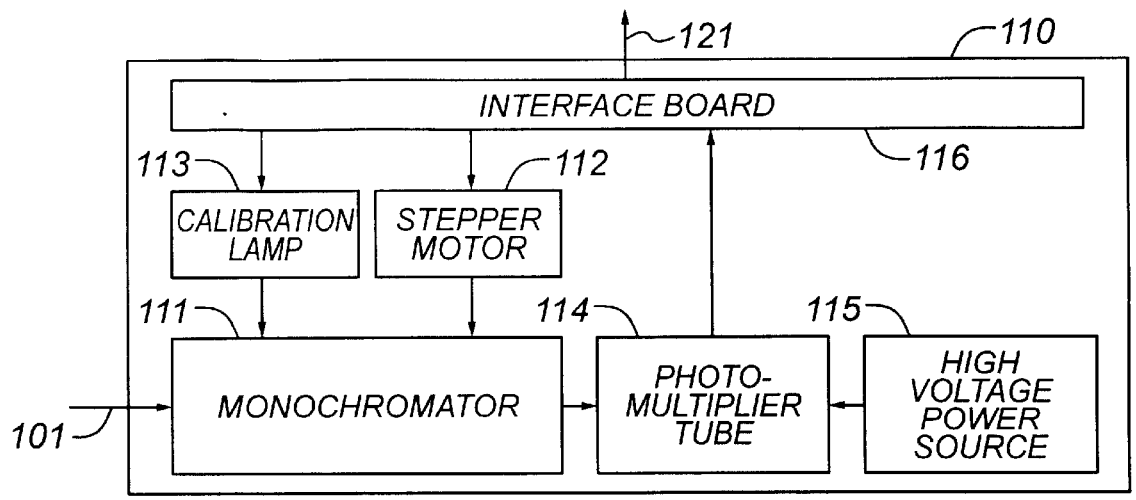
FIG. 5 is a schematic block diagram of an endpoint detection apparatus according to the present invention that is capable of detecting and monitoring a plasma emission from the chamber.

In general, the fiber optic cable 101 transmits attributes of the energized gas or plasma from the chamber to a monochromator 111, as shown in FIG. 5. A stepper motor 112 controls the wavelength selection for the monochromator 111, and a calibration lamp 113 calibrates the monochromator 111. The monochromator 111 converts the light signal carried by the fiber optic cable 101 into an electrical signal which is amplified by a photomultiplier tube 114 powered by a high voltage power source 115. The output of the photomultiplier tube 114 is coupled to the monochromator interface board 116. The monochromator interface board 116 is coupled to the stepper motor 112 to allow selection of a particular wavelength for monitoring the process being conducted on the substrate 20, for example, endpoint determination for an etching process. The stepper motor 112 controls the position of an interference grid within the monochromator 111 to select a wavelength. The interface board is also coupled to the calibration lamp 113 to calibrate the monochromator 111 at a particular wavelength. The interface board is coupled to a cable that carries an output signal 121 from the optical emission detection system 110. Alternatively, the monochromator-based system can be replaced by a bandpass photon detector system, such as the system disclosed in U.S. patent application Ser. No. 08/800,003, filed Feb. 13, 1997, now U.S. Pat. No. 5,995,235, and incorporated herein by reference.

The optical emission system data 121 is supplied to the computer controller system 200 through controller electronics having a controller interface board. The controller 200 analyzes the optical emission system data 121 and monitors process parameters 131 as discussed below to accurately determine a process endpoint. The hardware for implementing the endpoint detection is available from Applied Materials, Inc. of Santa Clara, Calif. The fiber optic cable 101 is available as part number 0190-09134, the monochromator 111 as part number 0010-09935, and the controller electronics as part number 0240-10475 and the controller 200 as part number 0240-32585.

Etching and Endpoint Detection Process

An example of a substrate processing and endpoint detection method according to principles of the present invention will now be described, with reference to an exemplary etching process, in which a polysilicon overlayer 30 on a gate oxide (silicon dioxide) underlayer 28, is etched without etching or damaging the underlayer. The substrate 20 is transferred by a robot arm from a load-lock transfer chamber 42 through a slit valve and into a process zone 44 of the chamber. The substrate 20 is held on the support 46 by an electrostatic chuck and helium is supplied through apertures in the chuck to control the temperature of the substrate. Thereafter, the process parameters in the process chamber 42 are set to process the layer on the substrate 20, the process parameters comprising one or more of process gas composition and flow rates, power levels of gas energizers, gas pressure, and substrate temperature. The process can also be performed in multiple stages, for example, each stage having different process conditions. For example, in an etching process, one or more compositions of process gas comprising etchant gas for etching the substrate 20 are introduced into the chamber 42 through the gas distributor. Suitable etchant gases for etching layers on the substrate 20, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The chamber 42 is typically maintained at a pressure ranging from about 0.1 to about 400 mTorr. The etchant gas composition is selected to provide high etch rates and/or high etching selectivity ratios for etching the overlayer relative to the underlayer. When multiple layers are being sequentially etched, first, second, third, etchant gas compositions can be sequentially introduced into the chamber 42 to etch each particular layer.

The process gas in the process zone 44 is energized and maintained at first process plasma parameters suitable for etching a layer on the substrate 20. Referring to FIG. 2, a plasma is energized from the etchant gas using the plasma generator 56 by inductively and/or capacitively coupling energy into the process zone 44 of the chamber 42, or by applying microwaves to an etchant gas in a remote zone of a remote chamber (not shown) that is at a location remote from the process zone. By "energized process gas" it is meant that the process gas is activated or energized so that one or more dissociated species, non-dissociated species, ionic species, and neutral species are excited to higher energy states in which they are more chemically reactive. Preferably, the process gas is energized by applying an RF source current to the inductor antenna 58 encircling the chamber 42 and optionally by also applying an RF bias voltage to process electrodes. The etchant plasma or energized gas etches the layer on the substrate 20 to form volatile gaseous species that are exhausted from the chamber 42.

After a given thickness of the layer is processed, an endpoint detection method is used to detect the thickness of the layer and change process conditions in the chamber 42. In etching processes, the endpoint detection method can be used to control the processing of the substrate 20, for example it can be used to terminate the processing of the layer or to change the process gas composition to provide particular etching rates or etching selectivity ratios.

When in use, the processing chamber, for example a plasma etching chamber, emits radiation such as light having an intensity, I, that should remain within a well-defined set of limits in a properly operating chamber, assuming the process chamber is functioning to order and excluding ramp up and ramp down. A measurement of the radiation intensity will, in this case, provide an accurate determination of the endpoint of the process. However, if certain operating conditions—for instance, process parameters and process variables—in and around the process chamber vary too greatly from their typical or normal values, the radiation intensity will accordingly be altered and the measuring system might give misleading data readings. These conditions include for example, but are not limited to source power, RF power, RF power forward, RF reflected power, RF peak-to-peak voltage and current and phase, RF load position, RF tune position, chamber pressure, gas flow rates, gas flow to cool wafer backside, throttle valve position, wavelength, exposed oxide area, magnetic field strength, etch rate, DC bias, helium leak rate, and other variables and parameters in and near the process chamber.

The intensity of the radiation, I, is a function of these conditions or parameters. For exemplary purposes and for the sake of clarity, the intensity, I, can be considered to be a function of wavelength, RF power, chamber pressure and gas flow rates and can be expressed as $I=I(\lambda, R, P, F_1, F_2, F_3)$. Any number of conditions or parameters can be considered, of course, and the accuracy of the device would improve with the more parameters considered. At a fixed wavelength, $\lambda$, a first order Taylor expansion for this example would result in $$\frac{\Delta I(\lambda)}{I(\lambda)} = A_R \frac{\Delta R}{R} + A_P \frac{\Delta P}{P} + A_{F1} \frac{\Delta F_1}{F_1} + A_{F2} \frac{\Delta F_2}{F_2} + A_{F3} \frac{\Delta F_3}{F_3}$$

where $\Delta X/X$ (with X=I, R, P, $F_1$, $F_2$, $F_3$) is the relative change, and $A_x$ is the response coefficient. In practical applications, these process variables exhibit fluctuations during substrate processing causing the intensity, I, and thus the optical emission signals to fluctuate accordingly. This fluctuation can result in false endpoint signals and a false indication by the endpoint detection system 100 that the endpoint has been attained. The etching may then be terminated or altered prematurely, resulting in not enough etching or may be terminated too late, resulting in an undesirable and uncontrolled etch into a lower layer on the substrate 20. Similarly, a deposition or other processing step that is being controlled by the endpoint detection system may also be terminated or altered at a less than ideal stage in the process.

In one embodiment of the present invention, these process conditions are used to qualify endpoint detection decisions that are based on the intensity of radiation having predefined wavelengths that is emitted from the plasma and that varies during different stages of the process, such as optical emission signals. The process variables and the radiation emission signals are analyzed with predefined algorithms. If abnormal changes in process condition signals occur at the same time that the radiation emission signal indicates an endpoint, the controller 200 will issue a false or fault endpoint signal or message. An abnormal change in process condition signals is defined as change in the signal that exceeds the boundaries predefined in the algorithms within specified time windows.

The controller 200 receives data related to the emission intensity of the plasma 121 and monitors process conditions 131 by, for example, conventional sensors 228. For example, RF variables and signals such as forward power, reflected power, DC bias, RF match load, tune position, and the like, chamber pressure signals, gas flow rate signals, and/or throttle valve position signals are acquired and monitored. The controller 200 may include a computer system that houses software algorithms that are used to analyze these signals. The emission intensity signal 121 and all or any number of the monitored process chamber condition signals 131 are analyzed by algorithms to accurately determine when endpoint has been reached. The endpoint can be indicative of a completion of processing, for example etching or depositing, of a layer on a substrate 20, or it can be indicative of a particular amount of processing having occurred. For instance, in some etching processes it is desirable to leave a thin film of a layer to cover an underlying layer. In these situations, it would be desirable to signal an endpoint before the complete etching through of a layer. In some other instances, it is desirable to etch (or deposit) a layer to a first thickness under first process conditions and then to etch (or deposit) a remaining or second thickness of a layer under second process conditions. The second conditions can protectively etch (or deposit) at a slower rate or one of the first and second process conditions can include a cleaning gas to simultaneously clean a process chamber during the processing of the layer on the substrate 20, as another example.

Figure 6A:
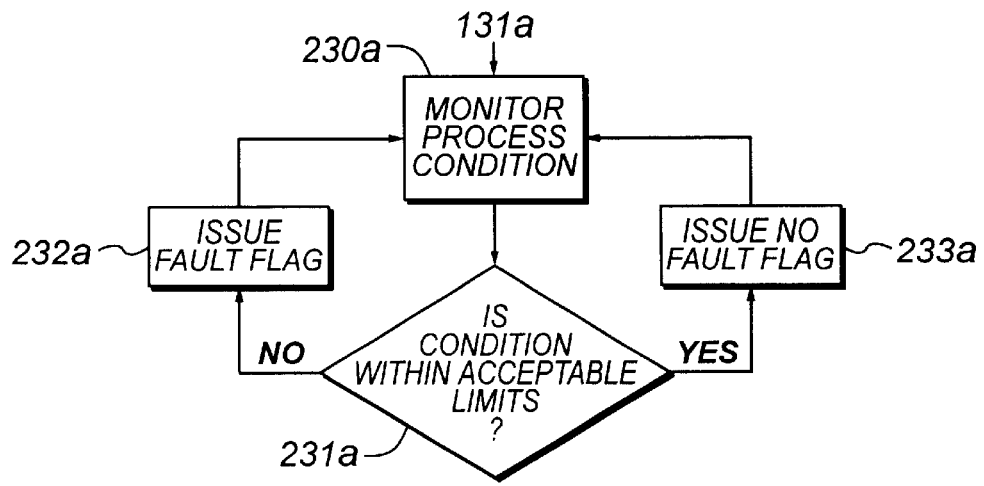
FIG. 6a is a flowchart showing process steps of a process condition monitoring algorithm according to the present invention.
Figure 6B:
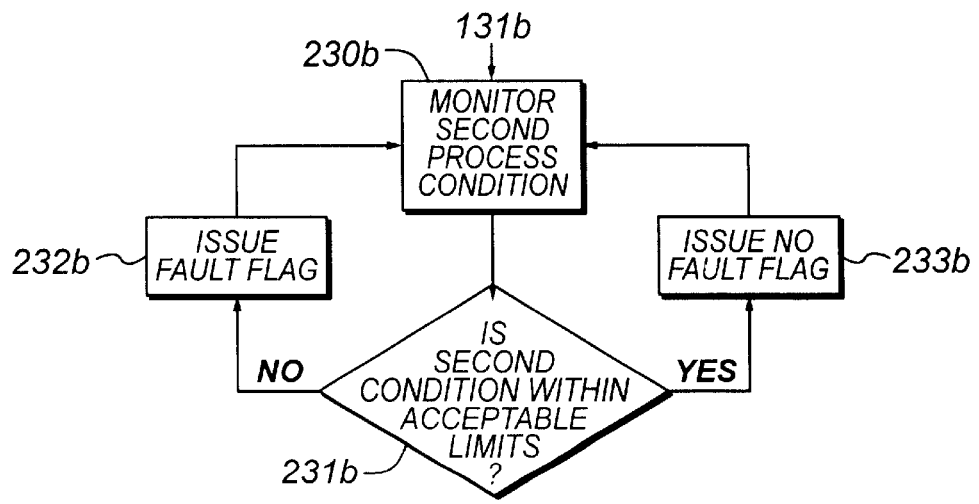
FIG. 6b is a flowchart process steps of a second process condition monitoring algorithm according to the present invention.

All of the data is analyzed with predefined algorithms, for example as shown in FIGS. 6a, 6b, 7, and 7a. A particular processing condition, such as a process parameter like an RF component, is constantly monitored in real time throughout the processing of a layer on a substrate 20. For example, a signal 131a, indicative of the value of the measured RF component power is monitored 230a. The monitored condition is then compared to a predefined range of predetermined values 231a which are deemed acceptable and within normal ranges for the type of process being conducted in the chamber. The predetermined values 231a may be empirically determined by monitoring a range of values through which a process condition normally fluctuates during a typical process (or from a statistically relevant population of processes) conducted in the chamber, or by calculating nominal values or acceptable ranges of values that account for normal noise fluctuations of a particular process condition based on the threshold value of the process condition. The controller 200 monitors a process condition and when the process condition falls outside the range of the predetermined values (which indicates that the condition being monitored is not operating properly), the controller 200 issues a fault or warning flag 232a. Monitoring continues and the flag remains issued until the monitored condition is within the predetermined range. If the monitored condition is within the accepted range, no fault or warning flag is issued 233a, or a previously issued fault or warning flag is retracted if a toggle type flag is used. FIG. 6b illustrates how the same type of process is performed to determine the operating level of another process condition, such as a process parameter like DC bias or chamber pressure or throttle valve position. The signal 131b, indicative of the second process condition, is monitored 230b and compared against a range of predetermined values 231b for that condition. A fault flag or fault signal is either issued 232b or not issued 233b (or retracted) in a similar fashion to the first process condition as described above in conjunction with FIG. 6a. A third, fourth, fifth, etc., condition can similarly be monitored and flagged when not operating at predetermined levels. Each signal 131a, 131b, etc., has an associated algorithm 231a, 231b, etc. The algorithms include digital filters and event triggering mechanisms. The fault or warning flags 232a, 232b, etc., are triggered by exception variables. Otherwise the fault or warning flags 232a, 232b, etc., are set to zero 233a, 233b, etc. It should be noted that the process could also operate by issuing non-fault signals or flags when the conditions are within the predetermined values.

The accuracy of the process monitoring improves with the number of conditions selected to be monitored. For example, the process may be monitored by monitoring a single process condition such an RF component or DC bias. However, it has been found that simultaneously monitoring a plurality of process parameters and variables, such as two or three conditions, for example, by monitoring RF power and chamber pressure; or by monitoring RF power, chamber pressure and gas flow rates. Monitoring multiple process conditions provides a determination of a chamber operating condition (such as an endpoint) that is valid for all of the multiple process conditions. Therefore, an operating condition measurement based on multiple process conditions is more likely to be valid (or more accurate) than a determination in which only one process condition is detected or monitored and the other relevant process conditions are not detected or monitored. Thus, properly selected dual or triple condition monitoring processes may significantly improve the endpoint determination and reduce the number of false endpoint signals.

Figure 14:
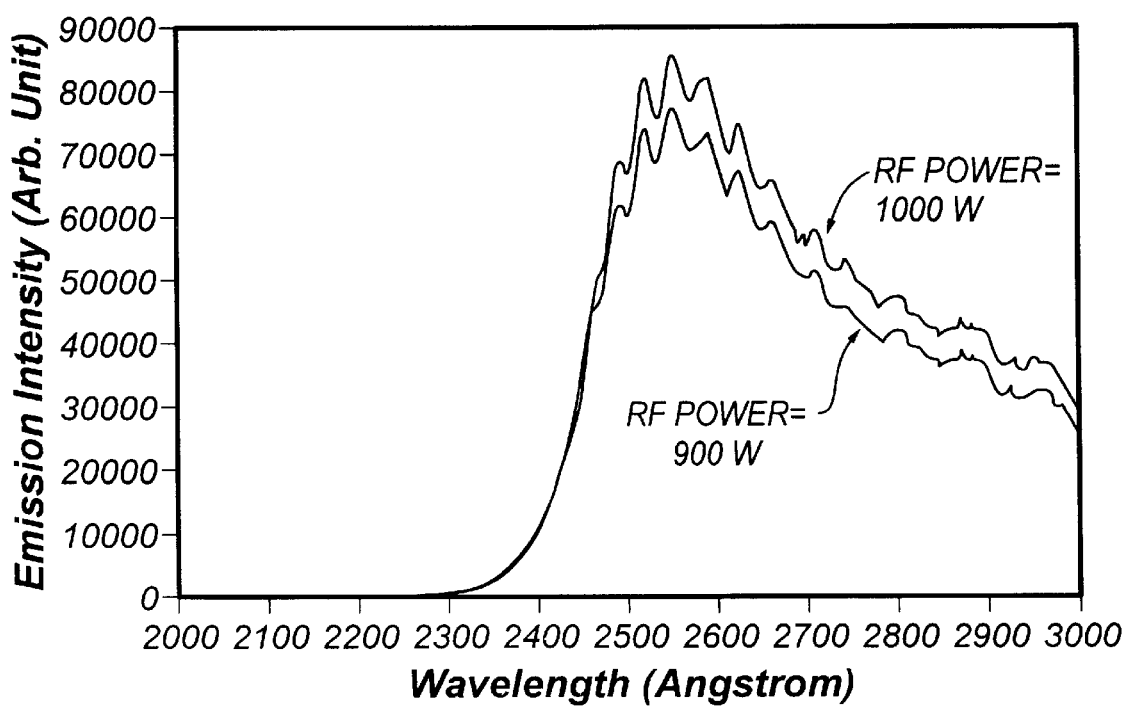
FIG. 14 is a graph showing the power input influence on an optical emission spectrum in an oxide etch chamber.

The effect of RF power on the emission intensity is illustrated in FIG. 14, which shows an optical emission spectrum from an oxide etch process performed in an Applied Materials M×P+oxide chamber. The bottom trace is the emission spectrum corresponding to a RF power of 900

W, while the top trace is obtained when the RF power is increased to 1000 W. Here, the increase in emission intensity is due solely to a change in the RF power (a process parameter) and is not an accurate indication of a true endpoint. Therefore, if one relies only on the emission intensity change as a process endpoint indicator, without simultaneously monitoring the RF power (or other exception variables) during etching, one may misinterpret the emission intensity change resulting from RF fluctuation as an etch endpoint. In contrast, by monitoring the RF power or other conditions, along with emission intensity, the present invention provides a method of qualifying the control event to avoid a false endpoint.

Other process conditions, such as throttle valve position and gas flows, can also be incorporated within this architecture. All the data from the process conditions are analyzed with pre-defined algorithms or thresholds. For example, the process conditions are monitored to detect any variations with respect to their respective pre-defined boundary values. For any detected non-zero variation from the boundary value, a variation may be calculated for each of these process conditions. The variation can be represented either as a difference, a fractional change, or as a ratio between the observed variable and its boundary value. If an abnormal change in RF or chamber pressure signal is detected prior to the detection of an endpoint, the endpoint detection system 100 will send a false endpoint. An abnormal change in RF or pressure signals is defined as a change in RF or pressure signals that exceeds the boundaries pre-defined in the algorithms within specified time windows, e.g., one to five seconds prior to endpoint detection. The appropriate time windows or criteria may vary with the specific exception variables or the specific process applications. Such time correlation criteria may include situations in which an exceptional event occurs after a control event.

Preferably, multiple process conditions are monitored simultaneously with the optical emission signal 121. The optical emission signal 121, as shown in FIG. 7, is monitored 220 and an algorithm 221 is used to assess if the emission signal 121 is indicative of an endpoint being reached. If no endpoint has been identified, the monitoring continues. If the emission signal 121 is indicative of an endpoint, the presence or absence of fault flags is detected 222. If a fault flag is detected, for example, if condition signal 131a is not within predetermined levels and thereby triggers fault flag 232a, then a signal indicating a false endpoint is issued 225. If no fault flags are detected, an endpoint signal is issued 223. The computer controller 200 may use the endpoint signal 223 to initiate a change in the processing conditions as will be discussed below. The process could alternatively check for the presence of non-fault flags or signals, as mentioned above. In this light, the absence of a non-fault signal or non-fault flag should be considered to be included in the terms "fault flag" and "fault signal."

Figure 7A:
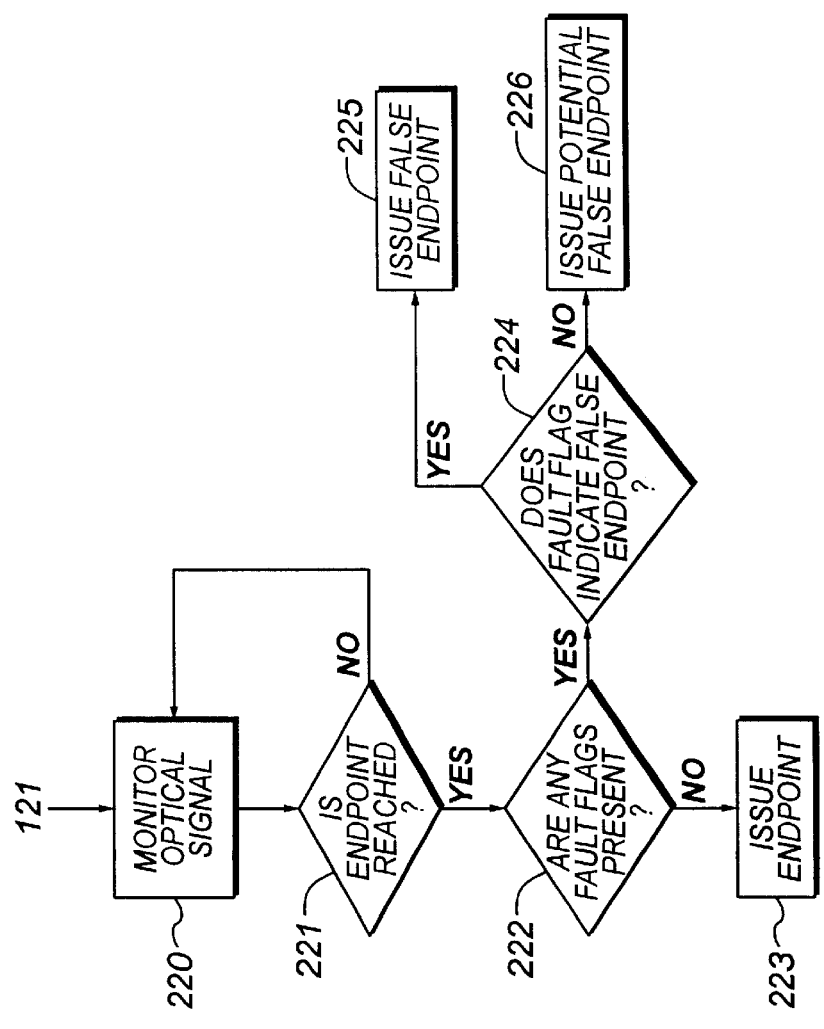
FIG. 7a is a flowchart showing process steps of an endpoint or false endpoint or potential false endpoint signaling process according to the present invention.
Figure 7:
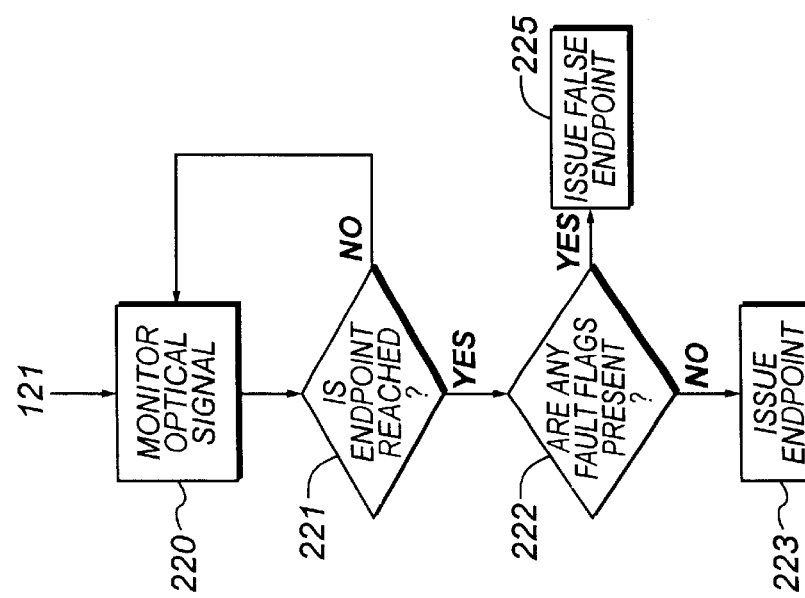
FIG. 7 is a flowchart showing process steps of an endpoint or false endpoint signaling process according to the present invention.

In the embodiment shown in FIG. 7a, an intermediate step 224 queries whether variations in a monitored and flagged condition constitutes a warning or a true fault situation. Some process conditions, for instance some particular process parameters, can be determined to be notorious for causing and being indicative of false endpoints. Some other conditions can be determined to be less causal of actual false endpoints. In the latter case, it is desirable to issue a potential false endpoint 226 rather than a false endpoint signal 225. This variation in the definition of faults allows for flexibility in controlling the process. For example, a false endpoint signal can be used to stop the process while a potential false endpoint signal can be used to simply issue a warning and allow the processing to continue. Some type of process evaluation may then take place.

One or more conditions or variables are defined as control variables. Signal 121 in FIG. 7 represents the control conditions and is shown in FIG. 7 as the optical emission signal 121. The signals 131a, 131b, etc., in FIGS. 6a and 6b represent exception conditions. The algorithm or algorithms for the control conditions are designed to trigger a control event, such as endpoint detection, upon an appropriate change in each or a combination of the control conditions. The algorithm or algorithms for the exception conditions are designed to trigger only if the exception condition, or change in the exception condition, lies outside a predefined boundary. When an excursion which is not within the predefined boundary occurs, an exception event is issued. If the control event occurs concomitantly with the exception event, a fault or warning 225 is issued, generally halting processing of the substrate 20.

The data acquisition, real-time analysis, and logical decision making reduces the possibility of false control events and provides data on process variables responsible for false control events. The flags can serve as error-detectors to be classified and studied. Particularly flag-prone conditions can be indicative of defective parts of the processing apparatus 42. Analysis of these flag signals can reduce diagnostic expenses and time. Also, if a flagged condition halts the processing of a substrate 20 and the subsequent evaluation of the substrate reveals adequate or predetermined endpoint determination, the algorithm for the flagged condition can be altered. Preferably, the fault or warning is issued 225 if even a single flag is detected. Alternatively, the fault or warning 225 can be issued only if two or more flags are detected.

In general, the algorithms can be empirically derived. Alternatively, the algorithms can be rule based or taught. Event triggering logic used in the algorithm can be Boolean logic, fuzzy logic, or weighted logic, as will be discussed below. An exemplary embodiment of the present invention uses optical emission data as the control condition. The exception conditions are preferably one or more of an RF component such as RF power, DC bias, chamber pressure, and gas flow rates.

In another preferred variation of the invention, the optical emission signal 121 can be substituted for one of the process conditions 131a, 131b, etc. In other words, a monitored process parameter can be used as the control condition shown in FIG. 7 and the optical emission signal can be monitored as shown in FIG. 6a to issue flags. An endpoint signal would then be issued 223 when a condition falls within predetermined levels and when the optical emission signal issues no flag.

Figure 8:
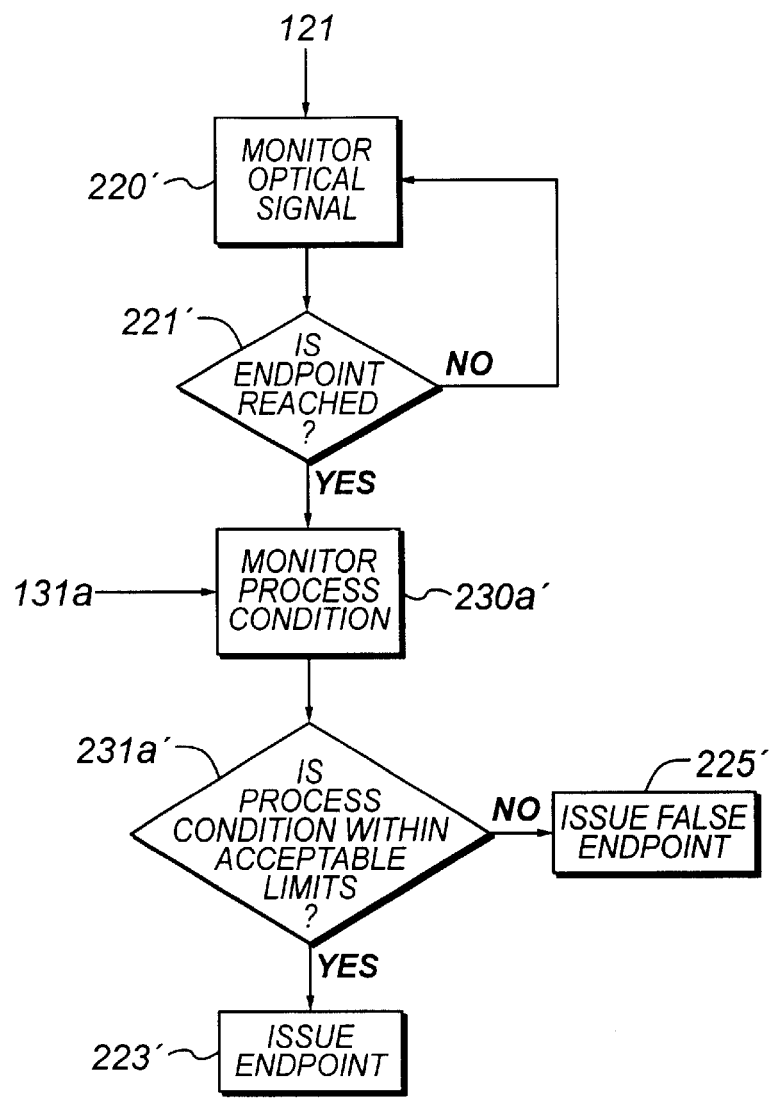
FIG. 8 is a flowchart showing another embodiment of the endpoint or false endpoint signaling process.

In still another preferred variation, all of the conditions need not be constantly monitored. For example, as shown in FIG. 8, the optical emission signal 121 can be monitored 220' as described above. When the emission signal 121 indicates an endpoint has been reached 221', a condition signal 131a may then be monitored 230a'. If the process condition being monitored is within the predetermined range 231a', an endpoint is issued 223'. If the condition is not within the predetermined range, a false endpoint signal is issued 225'.

In operation, the endpoint detection system 100 continuously monitors the operation of the processing system 40 by monitoring radiation such as the optical emission data or other control data 121 as well as process condition data 131. The controller 200 provides a continuous output signal 301 controlling the overall operation of the processing system 40. The controller 200 comprises a computer readable medium having computer readable program code embodied therein that monitors the signals 121, 131. The controller 200 houses the algorithms as discussed above and constantly produces an output signal 301. The output signal indicates either (i) no endpoint has been reached, (ii) endpoint has been reached, or (iii) a fault endpoint has been reached. If no endpoint has been reached, the process conditions are unchanged and the processing of the layer on the substrate 20 continues. If an endpoint has been reached, the output signal is used to control the operation of the process by, for example, at least one of the following steps: (i) adjusting the operating power level of the gas energizer, (ii) adjusting process conditions in the process chamber, (iii) changing the flow rate of process gas, or (iv) terminating a process conducted in the process chamber 42. If a fault endpoint has been reached, the processing of the substrate 20 is terminated or adjusted or evaluated. The computer controller may also drive a display or provide an alarm signal to notify an operator of the action being taken.

In operation, a user enters a process set and process chamber number into the process selector program code via the input devices 205. The process sets are composed of process parameters necessary to carry out a specific process in the chamber 42, and are identified by predefined set numbers. The process selector program code identifies a desired process chamber, and the desired set of process parameters needed to operate the process chamber for performing a particular process. The process parameters include process conditions, such as for example, process gas composition and flow rates, chamber temperature and pressure, plasma parameters such as microwave or RF bias power levels and magnetic field power levels, cooling gas pressure, and chamber wall temperature as discussed above.

The system may be designed so that the operator can select the process conditions to be monitored. The operator can then select the control variables and the exception variables. The operator can also select the algorithms to be used and can vary the ranges used within the algorithms. When an endpoint is reached, the computer initiates a control code that comprises program code instruction sets for controlling the gas energizer via a gas energizer program code, controlling the process gas introduction via a process gas program code, and controlling other chamber conditions via a chamber condition program code.

Figure 9:
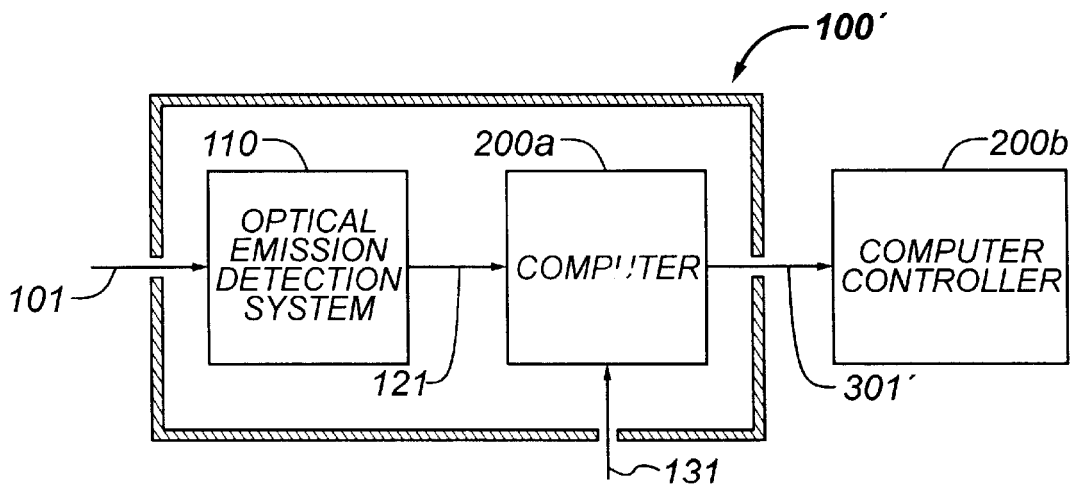
FIG. 9 is a schematic block diagram of another endpoint detection apparatus according to the present invention.

Alternatively to the configuration shown in FIGS. 2–4, the endpoint detection system can be a self-contained unit as shown in FIG. 9. The self contained endpoint detection system 100' includes the optical emission detection system 110 and the controller electronics as discussed above. The self contained endpoint detection system 100' further comprises a computer 200a that houses and executes the algorithms discussed above. The output signal 301', which indicates either no endpoint, endpoint, or false endpoint, from the self contained endpoint detection system is supplied to a conventional mainframe computer 200b that is used to control the substrate processing.

In another embodiment, a network access system 400 allows for network access to process condition and endpoint determination data while maintaining real-time fidelity of the endpoint detection system 100. Network access to the history of all of the monitored conditions for substrate-to-substrate analysis, algorithm development, statistical analysis, troubleshooting, and problem resolution is necessary, but it is important not to compromise the fidelity of the endpoint detection system 100. If all users of a network were granted direct access to the controller 200 via a server, and especially at the same time, the potential for process corruption would significantly increase.

This problem is reduced or eliminated by providing a firewall between a network user 421 or server and the controller 200. The firewall provides a single choke or access point that may control the flow of data between one or more users, between a user and a controller, between the server and the controller, and through the networks that are connected to the controller. For example, one of the networks may be the internet or both the networks may be intranets. The firewall causes all communicative traffic between the computers to pass through a single narrow point of controlled access, which allows focusing on the problem of potential process corruption by allowing anti-corruption measures to be concentrated at the controlled access point. The firewall is especially useful to control data flow between the controller and the server.

The communications controlled by the firewall are typically between a controller for the process chamber 42 and a server that serves a number of users in a local area network (LAN) or a wide-area network (WAN). In fact the firewall is particularly useful in enterprise networks in which a number of individual LANs may be associated with different divisions of a company in a wide-area network. A local network area is a network in which the server computers are proximate to one another to offer a high speed communications system. A wide area network is a network that links at least two local area networks over a wide geographical area via one or more dedicated connections. The firewall is intended to shield the controller of the processing apparatus and its resources from the associated server and its users, so that the controller can efficiently operate the process chamber and receive time-sensitive or time-critical data signals without constantly being interrupted by requests or other communications from the server or users in the networked environment. Communicative data packets which flow between the users, server, and the controller, in either direction, should pass through the firewall.

For example, the firewall can be used to restrict access to the controller by individual users (through the server) in particular network environments. For example, if a research and development division of a company is in Japan and another one is in the United States, the firewall will allow computers of process engineers in Japan to communicate with a process apparatus and controller running a process in the United States laboratory in real-time mode. This offers a significant competitive advantage by allowing remote access to the processing apparatus and its data by qualified users. In addition, customers or suppliers interested in viewing the results of particular tests being conducted in a chamber, could dial up the server and receive the data without disturbing the functions of the controller.

The firewall is especially useful to serve as a barrier that reduces or prevents unnecessary or non-critical communications between controller and the server or other users. This allows the controller to perform necessary or time-critical tasks such as controlling the process conditions in the chamber, receiving data signals from the components of the process chamber, or analyzing the signals, without unnecessary breaks or interrupts in the communications. If the server or the user were allowed to continuously access the controller, the controller would be interrupted in the continuous or high speed acquisition of data from the controller, and it would not function effectively.

The firewall is typically computer hardware or software that selectively allows predetermined or desirable communications and disallows non-predetermined communications, especially between the controller and the server. To avoid possible conflicts or other compromises, the firewall should preferably be run on a dedicated controller board or computer, i.e., one which does not have other user-accessible programs running that could provide a path by which user communications would circumvent the firewall. In addition, the firewall can be combined with other software, program code, or instruction sets within the same computer system. The firewall may also be a combination of software applications, for example, a combination web or internet server and firewall. Also, related services may be hosted on the same computing platform used for the firewall, such as e-mail, web servers, databases, etc.

In one embodiment, the firewall comprises software (computer program code containing instructions) that read data packets sent between the controller and server or vice versa, to determine the values in the various fields associated with the data packet, and thereafter evaluate the values based on a decision making program to selectively allow the data packet to be transmitted or blocked depending upon the values. For example, the firewall may contain program code that uses data protocol to serve as a one-way communication link that only allows communication between the controller and the server, but not the other way, and that also does not allow any communications between the user and the controller. The software can also contain instructions that verify if the server is ready to receive a data signal transmission from the controller and then send the data signal to the server. When the server receives the data signal transmission, the server acknowledges the safe receipt of the data signal, otherwise, the controller re-sends the data. The number of times that the controller verifies whether the server is ready to receive the data transmission signal is in a predefined variable field that can be set by the systems administrator. This prevents the controller from getting hung-up by continuously trying to send data signals to the server, when for example, the server is inoperative, hung up, or simply busy answering users. The small number of verification of "ready" status calls made to the server by the controller and the acknowledgment responses from the server, ensure that the controller will not get hung up while sending data to an inactive server.

Figure 11:
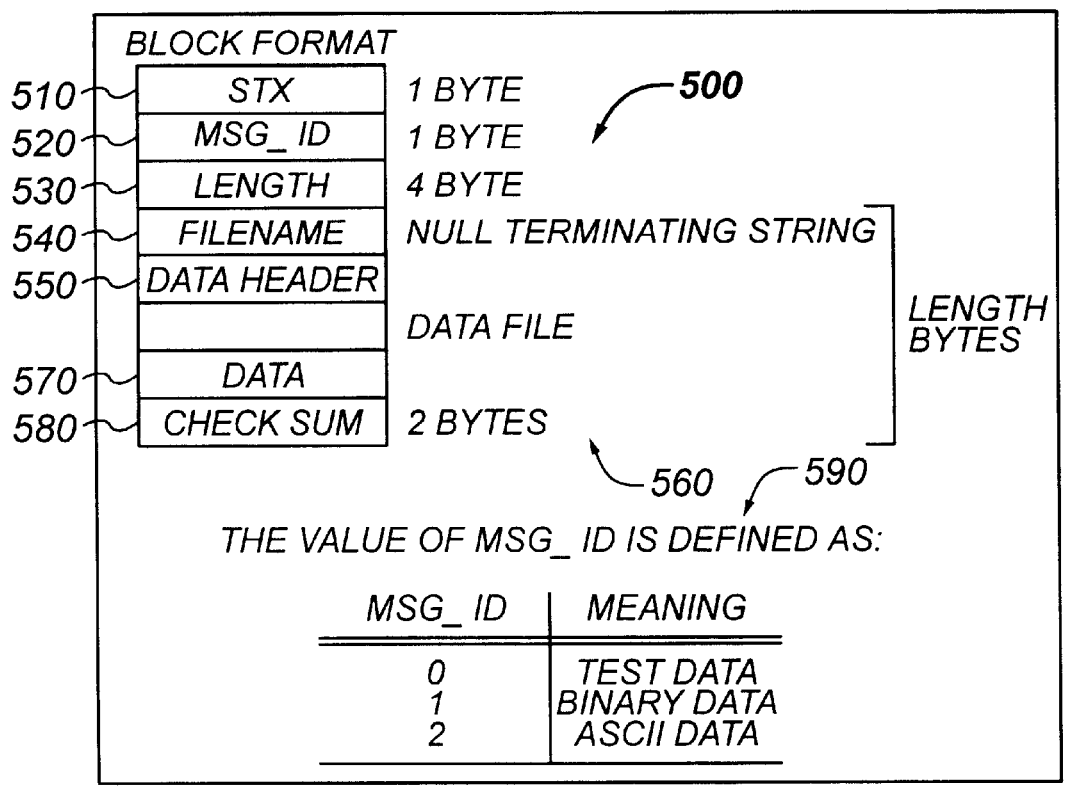
FIG. 11 is a schematic block diagram of the data transfer protocol useful in the present invention.

For example, in one embodiment, the data transfer between the controller 200 and the endpoint server 410 is performed by a data transfer protocol as illustrated in FIG. 11. The header structure 500 of the communication protocol comprises an STX field 510 (start-of-text), an MSG_ID field 520, a length field 530, a filename field 540, and a data header field 550. The STX field 510 may be used to alert the endpoint server 410 that a message is coming from the controller 200, and it prepare the endpoint server 410 to be ready to receive the message. The MSG_ID field 520 defines the format in which the data is being sent. For example, a "0" indicates that the data is "test data", a "1" indicates that the data is "binary data", and a "2" indicates that the data is "ASCII data," as shown at 590. The length field 530 is a field that defines the length of the file to be transmitted to the endpoint server 410. The information in the length field 530 can also be used for error recovery, for example check sum routines. The filename field 540 defines the name of the file to be transmitted to the endpoint server 410. The data header field 550 is used to define the nature of the data to be transmitted to the endpoint server 410, for example endpoint timing and the like. The data structure 560 of a communication protocol of the present invention comprises a data field 570 and a check sum field 580. The data field 570 carries data and the check sum field 580 carries information for implementing data error recovery, should data be improperly sent or received by the server.

In another embodiment, the firewall can also employ application level proxies or proxy services and packet filters to controlling access of users, or other servers, to the controller. Packet filtering is the action a firewall takes to selectively control the flow of data signals or other signals to and from the controller. Data packet filters prevent data packets originating from an user or server from reaching the controller, especially when the controller is busy performing a task or receiving a signal. Thus, the packet filters block certain data packets and rerouting other data packets. To establish packet filtering, a network administrator establishes a set of rules that specify what types of data packets (e.g., those to or from a particular IP address or port) are allowed to pass and which types of data packets will be blocked. Packet filtering may occur in a router, in a bridge, or on an individual host computer system. Packet filters are typically configured in a "default permit stance," i.e., that which is not expressly disallowed or prohibited is allowed. The packet filter must know what the traffic looks like in order to prohibit potentially harmful data packets. The filtering function is used to catalog the various types of potentially harmful data packets and to distinguish them from non-harmful or benign packets. The filtering packets deal with the most common types of interrupts and other user requests and the level of filtering can be set in the packet filtering means.

In yet another embodiment, the firewall can also use a "stateful inspection" can be used to perform packet filtering not on the basis of a single packet, but based on a historical window of packets that are received on the same port and suitably recorded for operation of this system. A stateful inspection enhances the level of security achievable using packet filtering. The historical window of data packets enables the filter to more accurately identify harmful packets and build the intelligence to determine what it is looking for in order to deal with an almost infinite variety of possible data packets and data packet sequences.

In a further embodiment, the firewall may also rely on proxy services. A "proxy" is a program running on an intermediate system that deals with the controller on behalf of users or servers. The users or servers that are attempting to communicate with a controller on a network that is protected by a firewall, request for connection to a proxy-based intermediate system. The intermediate system may relay an approved request to the controller and relay answers back to the users or servers. Proxies generally require custom software, such as proxy-aware applications or custom user procedures, in order to establish a connection. Custom software for proxying requires that the software to be designed for the apparatus and requires that an operator perform extra manual configuration steps to direct the software to contact the proxy on an intermediate computer system. In the other custom procedures, the user may tell the user or server to connect to the proxy and then tell the proxy which controller to connect to.

In operation, a request may be received from a server or user 421 to allow a remote procedure call to pass through the firewall to the controller 200, or the controller 200 may pass a signal or other information to the server. In the case of the user/server request, it is processed to determine whether the user/server is authorized to send the call through the firewall. If they are authorized, then an identification of the user/server may be stored in association with the firewall, and the remote procedure call is allowed to pass through the firewall to the controller 200. Otherwise, the firewall denies authorization to the user/server.

Alternatively, firewall can also be pre-programmed to simply ignore all requests from the users or the servers, and simply serve as a one-way communications link between the controller and the server. This would prevent all communications originating from a user or a server to reach the controller, thereby allowing the controller to operate in an unimpeded and un-hampered manner.

In the reverse sequence, when the controller needs to pass information or other signals, such as data signals, on to the server, the controller must pass the information through the firewall. A polling program may also be used to poll the server to see if it is ready to receive the information, and if it is, the information is passed on to the server.

Figure 10:
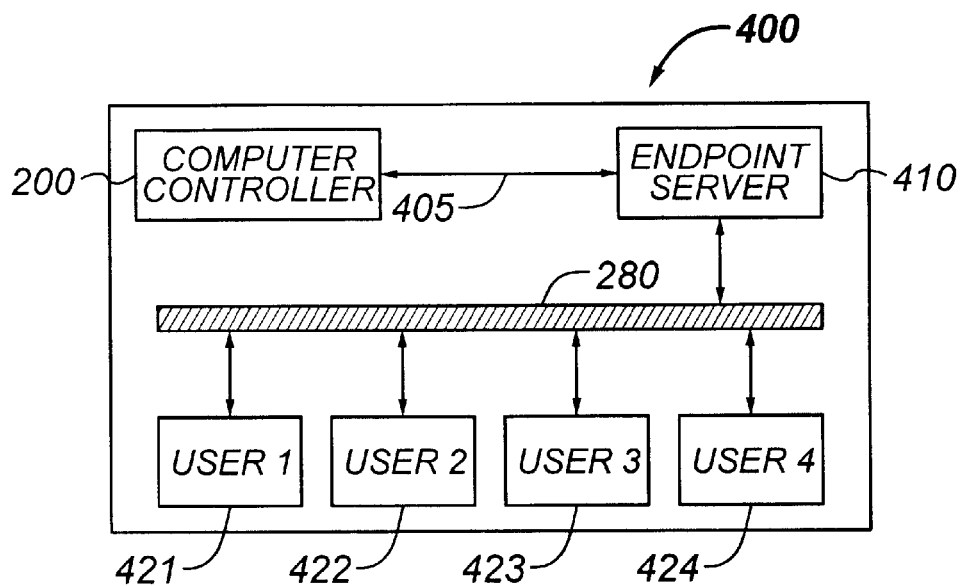
FIG. 10 is a schematic block diagram of a network access system according to the present invention.

To allow for network access to information and data that is not time critical, endpoint trace files and log information are immediately available on a server 410, as shown in FIG. 10. The end point trace files include but are not limited to temporal data for both the control variables and the exception variables, for example. The log information includes but is not limited to control events, substrate identification, process conditions and recipes, cassette identifications, and slot numbers, for example. Any other pertinent information about the processing and the endpoint detection can similarly be loaded onto the server 410. The data transfer between the two computers is via a serial port and high speed serial link 405 at a speed of 115 kB/sec. The data transfer is managed by real-time endpoint software. The off-loading of the non-time critical tasks to the server 410 results in a predictable impact on the time critical tasks running on the controller 200. The computer controller in this embodiment can be either the controller 200 shown in FIGS. 2 and 4 or the combination of computers 200a, 200b shown in FIG. 9.

Using the network access system of FIG. 10, one or many users 421, 422, 423, 424 can remotely access the endpoint trace files or endpoint log files via an operating system such as Windows NT. This access occurs without disturbing the operation of the endpoint detection system 100. The endpoint trace files and log information are immediately available on the endpoint server 410 for reprocessing or review at remote terminals as soon as the substrate 20 is processed. The computer controller 200 and the endpoint server 410 preferably share the same power supply and backplane. The two computers run separate operating systems which are designed for separate requirements. The computer controller 200 which is responsible for data acquisition and process control is isolated by a firewall, as discussed above, from non-time critical process demands and is isolated from failures of a network. Preferably the endpoint trace files are automatically backed up. It is further desirable to be able to access multiple endpoint detection systems 100 from a single remote terminal.

Figure 12:
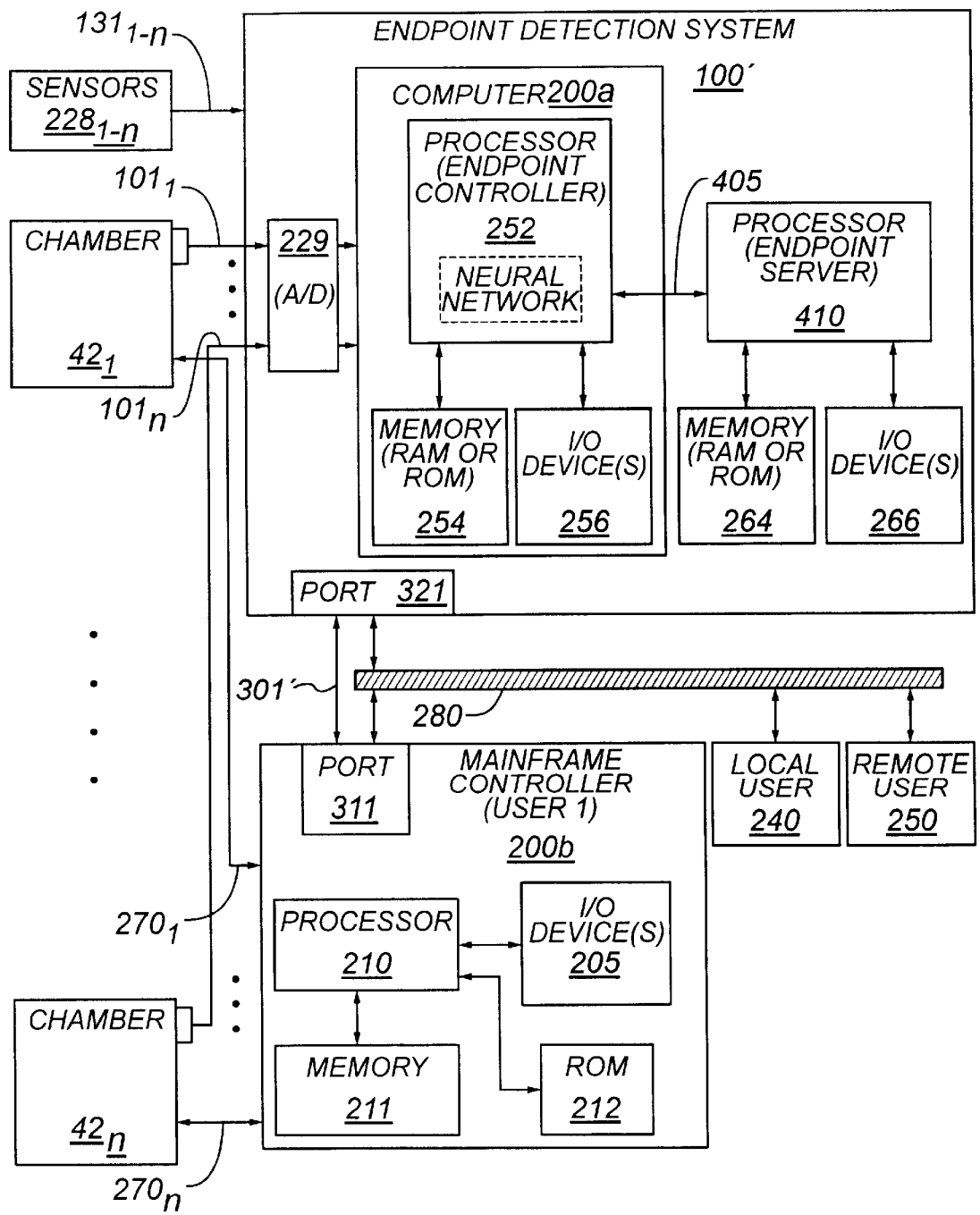
FIG. 12 is a schematic block diagram of an endpoint detection system and network access system for use with multiple process chambers.

An example of an interaction of the parts of the present invention is shown in FIG. 12. The controller 200 in this preferred embodiment is implemented as a general purpose computer 200b (e.g., a maintenance computer, a workstation or a personal computer) for controlling one or more chambers $42_1$–$42_n$ via communication paths $270_1$–$270_n$. The computer 200b may comprise a central processing unit (CPU) or processor 210, a memory 221, a ROM 212 and various input/output devices 205. In this preferred embodiment, the computer 200b (a computer based on the 680×0 series processors from Motorola of Schaumburg, Ill.) monitors and controls the various substrate processing steps in the chambers $42_1$–$42_n$.

To assist in its control functions, the controller 200b communicates with an endpoint detection system 100' via a communication port 311 and communication channel or link 301'. In one preferred embodiment, the communication link 301' is a RS-232 serial interface. Alternatively, other bi-directional communication links 280 can also be employed, e.g., Ethernet or digital interface. The endpoint detection system 100' detects and notifies the controller 200b of the occurrence of a control event during substrate processing, e.g., endpoint detection.

The endpoint detection system 100' in the present invention may comprise optical, RF, and pressure sensors 228, multi-channel high speed and high resolution A/D data acquisition circuitry 229, and a general purpose computer 200a. The general purpose computer 200a comprises a central processing unit (CPU) or processor (endpoint controller) 252, a memory device 254, and various input/output (I/O) devices 256. For example, the memory device 254 may comprise a random access memory (RAM) and/or read only memory (ROM). I/O devices 256 may include, for example, a keyboard, a mouse, a touch pad, a display, a printer, storage devices, including but not limited to, a tape drive, a floppy drive, a hard disk drive, or a CD ROM drive. Software applications or methods that are described below can be loaded from a storage device and resides in the memory 254 of the general purpose computer 200a. As such, the methods of the present invention as described below can be stored on a computer readable medium. Alternatively, the functions performed by methods of the present invention can also be implemented in part or in whole as hardware, e.g., application specific integrated circuit (ASIC).

Unlike traditional endpoint detection systems, the endpoint detection system 110' further incorporates an additional processor 410, which is a dedicated endpoint server for off-loading non-time critical tasks, such as network access of endpoint trace files or log files, from the endpoint controller 252.

More specifically, in one preferred embodiment, both endpoint controller 252 and endpoint server 410 are single board computers (PV5000HX from Texas Micro Inc., Houston, Tex.) and are deployed in a single chassis using a split passive backplane such that both share a common power supply. The endpoint controller 252 communicates with the endpoint server 410 via a bi-directional communication path 405 at a speed of 115 KB/second, which can be a RS-232 serial interface as discussed below. In this embodiment, the controller 252 and the server 410 are separately connected to their own memory devices 254, 264 and I/O devices 256, 266. Alternatively, the controller 252 and server 410 may share a common memory device and I/O device. In general, different operating systems may be used in the endpoint server 410 and the controller 252. In one embodiment, a "Windows NT" operating system, for example, is employed on the endpoint server 410, while a simpler operating system, e.g., "DOS" is used on the endpoint controller 252.

All time-critical tasks such as real-time data acquisition, monitoring, analysis, and qualification of control events are handled by the endpoint controller 252. The endpoint controller 252 also handles some non-time critical tasks such as transferring acquired data to the server 410. Data transfer and storage are managed by the real-time endpoint software in a predictable manner as non-time critical tasks, without affecting the reliable and timely implementation of time-critical tasks. The acquired data such as endpoint trace files or endpoint log files are stored as historical data in mirror image files on memory devices associated with the endpoint controller 252 and endpoint server 410. For example, these data are available at the endpoint server 410 for remote access (e.g., from remote terminal 250) for reprocessing or review as soon as a substrate 20 is processed, without disturbing the operation of the endpoint controller 252.

Some illustrative time-critical tasks performed by the endpoint controller 252 include:

1. acquiring data of process variables (e.g., optical emission intensities) and process parameters (such as RF power, chamber pressure, and so on) from chambers $42_1$–$42_n$ with high precision and resolution so that time sensitive correlation is ensured;
2. monitoring or evaluating the data in real-time;
3. detecting a control event through evaluation of data of control variables;
4. qualifying the detected control event to ensure that is not a false endpoint; and
5. communicating with the external controller 200b.

In general, data acquisition involves analog/digital (A/D) conversion, handling interrupts, etc., and the amount of real-time data acquired may vary according to the specific application. Data monitoring may involve automated feedback. Detection of a control event is often performed by evaluating the acquired data using some pre-defined criterion, which can be incorporated within detection algorithms as discussed above.

By separating the time-critical and non-time critical tasks, the endpoint detection system 100' ensures timely response and control of substrate processing. The required response time for a control event (e.g., endpoint detection) varies with the specific process applications. For example, while over-etching at the metal level may cause undesirable effects associated with charging, the required time response tends to be less critical compared to gate etching. In come situations, a response time on the order of about 100 msec. may be needed. By off-loading non-time critical tasks (such as reviewing the endpoint data) to another processor 410, the impact on the time critical tasks running on endpoint controller 252 can be controlled and effectively managed. In the current implementation, the controller 252 is responsible for all real-time tasks and decision making.

Some examples of non-time critical tasks performed by the endpoint server 410 include:

1. receiving data sent by the endpoint controller 252;
2. generating historical data for storage; and
3. handling external requests from remote terminals.

External requests may be sent by local user 240 or remote user 250, and may include monitoring or reviewing data for troubleshooting, generating statistical process control reports, providing backup endpoint data files to a central database or distributed databases, and optimizing the detection algorithm by remote reprocessing of historical data files, among others. For example, in communicating with external devices, the endpoint server 410 uses communication port 321 to access the Ethernet link 280. Thus a remote user 250 can have access to various data associated with the chamber processes, e.g., endpoint trace files or endpoint log files and the like. It should be noted that data monitoring may be performed either as a real-time task by the controller 252, or as a non-time critical task by the controller 252 and/or server 410. Additionally, the monitoring can be conducted in an automated fashion or performed visually by operating personnel.

The advantages of such a division of tasks can be summarized as follows. First, by incorporating a dedicated endpoint server 410 to handle non-time critical tasks, the real-time critical tasks performed by the endpoint controller 252 are not compromised. It is important, from a reliability point of view, that the main functions of monitoring and detecting a control event, as well as real-time decision making, not be compromised as new functionalities are added to the present endpoint detection system 100'.

For example, servicing a request from a remote user 250 to access historical data from the endpoint detection system 100' involves the processing of interrupts, executing security checks (e.g., verification of passwords), and then servicing the actual request, e.g., the retrieval and sending of data to the remote user 250. With the endpoint server 410 providing these functionalities, the endpoint controller 252 is able to monitor the chambers $42_1$–$42_n$ uninterrupted.

A second advantage in the separation of tasks is the availability of a firewall, as discussed above, between the two processors 252 and 410, thereby improving system reliability. Namely, if the endpoint server 410 suffers a failure, the endpoint detection system 100' may still continue with its monitoring function and other tasks via the endpoint controller 252.

It should be noted that algorithms or thresholds for the process conditions can be empirically derived, rule based, or taught. Alternatively, data from the process conditions can be optionally provided to a neural network 257 (fuzzy logic or weighted logic). For example, FIG. 12 illustrates one configuration in which the neural network 257 is incorporated into the endpoint controller 252. Other configurations are also possible. One purpose in implementing a neural network is the benefit of "learning" the algorithms or thresholds for the exception variables, thereby allowing the algorithms or thresholds to be adjusted, as necessary.

A neural network 257 is a computational model composed of neurons (or simply nodes) and connections between the nodes. The strength of each connection is expressed by a numerical value called a weight, which can be modified. Similarly, the "firing" of each node is associated with a threshold numerical value, which is referred to as the nodes' activation. The activation of a given node is based on the activations of the nodes that have connections directed at that node and the weights on those connections. In contrast to conventional computers, which are programmed to perform specific tasks, most neural networks can be taught, or trained.

As discussed above, false endpoint detections may occur due to transient conditions, thereby increasing the difficultly in identifying the cause of the false detections. In addition, a false endpoint detection may result from a variable that has yet to be correlated as a potential source of endpoint detection. Thus, by providing data from the exception variables to a neural network, the neural network can be trained to modify the thresholds or algorithms of the exception variables or to identify new exception variables that have yet to be correlated as a potential cause for false endpoint detections.

Figure 13:
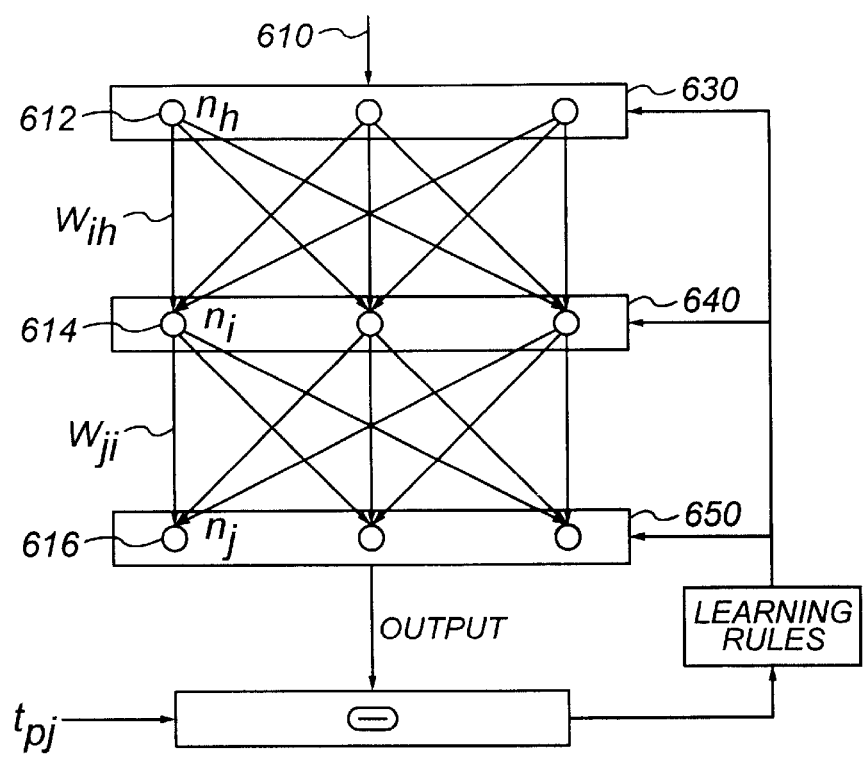
FIG. 13 is a block diagram of an exemplary neural network of the present invention.

FIG. 13 illustrates a block diagram of a neural network 257 for receiving condition data 610 as inputs. A typical neural network model has a set of input patterns and a set of output patterns. The role of the neural network is to perform a function that associates each input pattern with an output pattern. A learning process, such as "error back-propagation," uses the statistical properties of a training set of input/output patterns to generalize outputs form new inputs.

Error back-propagation is a well known supervised learning process through which a neural network learns optimal weights. Error back-propagation compares the responses of the output nodes to a desired response, and adjusts the weights in the network so that if the same input is presented to the network again, the network's response will be closer to the desired response.

Referring to FIG. 13, the learning rule of error back-propagation is applied to a multi-layer neural network having an input layer 630, an intermediate layer or so-called hidden layer 640, and an output layer 650. The output values of all nodes $n_h$ 612 in the input layer 630 are distributed as an input value to each of the nodes $n_i$ 614 in the intermediate layer 640. The output value of each of the nodes in the intermediate layer 640 is distributed as an input value to every node $n_j$ 616 in the output layer 650. Each node $n_j$ 616 produces a value which is the total net sum of output values of a node $n_i$ coupled to the output node $n_j$ by a coupled weight $w_{ji}$, transformed by a predetermined function f. This same concept applies to the intermediate node $n_i$ 614 with respect to input node $n_h$ 612.

Hence, the network acquires output value of the output node $n_j$ 616 of the output layer 650 by sequentially computing the output values of the input $n_j$ 616, each corresponding to a node form the input layer 630 towards the output layer 650.

In turn, the process of learning in accordance with error back-propagation consists of updating coupling weights $w_{ji}$ and $W_{ih}$, so that the total sum of the square errors between the output value of each node of the output layer 650 on applying the input pattern and the desired output $t_{pj}$, is minimized. Although a neural network using error back-propagation is described to process variable data, other neural networks can be employed to process variable data from a wafer processing chamber.

The present invention is described with reference to certain preferred versions thereof; however, other versions are possible. For example, other endpoint determining techniques can be employed, such as ellipsometry or laser interferometry. Additionally, conditions other than endpoint determination can be monitored. The process can be applied, as would be apparent to one of ordinary skill in the art, with etching chambers, sputtering chambers, ion implantation chambers, or deposition chambers, or in combination with other cleaning processes. Therefore, the spirit and scope of the appended claims should not be limited to the description of the preferred versions contained herein.

What is claimed is:

1. An endpoint detection method for a process performed in a substrate processing chamber with an energized gas, the method comprising:

(a) detecting a process variable of the process, the process variable comprising at least one of (i) a radiation emitted by the energized gas, (ii) a radiation reflected from a substrate in the chamber, (iii) a reflected power level of the energized gas, and (iv) a temperature in the chamber;

(b) issuing an endpoint signal when the process variable is indicative of an endpoint of the process;

(c) detecting a process parameter of the process, the process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position; and (d) determining if the endpoint signal is true or false by evaluating the process parameter.

2. A method according to claim 1 wherein (d) comprises determining the endpoint signal is true when the process parameter is a predetermined value or is in a range of predetermined values.

3. A method according to claim 1 wherein (d) comprises evaluating the process parameter to set a fault flag if the process parameter is not a predetermined value or in a range of predetermined values, and determining the endpoint signal to be false if the endpoint signal is issued and the fault flag is set or true if the endpoint signal is issued and the fault flag is not set.

4. A method according to claim 1 comprising monitoring a plurality of the process parameters.

5. A method according to claim 4 comprising monitoring at least three process parameters.

6. A method according to claim 1 comprising transferring the detected process variable and the process parameter to a server to allow a process controller to access the process variable and the process parameter to perform steps (b) and (d).

7. A method according to claim 6 comprising separating a process controller from the server with a firewall.

8. An endpoint detection method for a process performed in a substrate processing chamber with an energized gas, the method comprising:

(a) detecting a process variable of the process, the process variable comprising at least one of (i) a radiation emitted by the energized gas, (ii) a radiation reflected from a substrate in the chamber, (iii) a reflected power level of the energized gas, and (iv) a temperature in the chamber;

(b) issuing an endpoint signal when the process variable is indicative of an endpoint of the process; and (c) detecting a process parameter of the process, the process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position;

(d) evaluating the process parameter to set a fault flag if the process parameter is not a predetermined value or is not in a range of predetermined values; and (e) determining the endpoint signal to be (i) false if the endpoint signal is issued and the fault flag is set, or (ii) true if the endpoint signal is issued and the fault flag is not set.

9. A method according to claim 8 comprising monitoring a plurality of the process parameters.

10. A method according to claim 9 comprising monitoring at least three process parameters.

11. An endpoint detection method for a process performed in a substrate processing chamber with an energized gas, the method comprising:

(a) detecting an intensity of (i) a radiation from the energized gas, or (ii) a radiation reflected from a substrate in the chamber;

(b) determining if the intensity of the radiation corresponds to a first value or is in a first range of values;

(c) detecting a process parameter of the process performed in the chamber;

(d) determining if the process parameter is in a second range of values corresponding to a response coefficient in the equation:

$$\frac{\Delta I(\lambda)}{I(\lambda)} = A_R \frac{\Delta R}{R} + A_P \frac{\Delta P}{P} + A_{F1} \frac{\Delta F_1}{F_1} + A_{F2} \frac{\Delta F_2}{F_2} + A_{F3} \frac{\Delta F_3}{F_3},$$

where R is an RF power applied to the energized gas, P is a pressure of the gas in the chamber, F1, F2, and F3 are gas flow rates, and AR, AP, AF1, AF2, and AF3 are their respective response coefficients; and (e) determining if an endpoint of the process is reached when the radiation intensity is in the first range of values and the process parameter is in the second range of values.

12. A method according to claim 11 comprising monitoring a plurality of the process parameters.

13. A method according to claim 12 comprising monitoring at least three process parameters.

14. A method according to claim 11 comprising detecting a process parameter comprising at least one of (i) a source power, (ii) an RF forward power, reflected power, or match components, (iii) an RF peak-to-peak voltage, current or phase, (iv) a DC bias level, (v) a chamber pressure or throttle valve position, (vi) a gas composition or flow rate, (vii) a substrate temperature or composition, (viii) a temperature of a chamber component or wall, and (ix) a magnetic confinement level or magnet position.

15. An endpoint detection apparatus for detecting an endpoint of a process performed in a substrate processing chamber with an energized gas, the apparatus comprising:
(a) one or more detectors to detect:
(1) a process variable of the process, the process variable comprising at least one of (i) a radiation emitted by the energized gas, (ii) a radiation reflected from a substrate in the chamber, (ii) a reflected power level of the energized gas, and (iv) a temperature in the chamber; and
(2) a process parameter of the process, the process parameter comprising at least one of (i) a source power, (ii) an RF forward power, reflected power, or match components, (iii) an RF peak-to-peak voltage, current or phase, (iv) a DC bias level, (v) a gas pressure or throttle valve position, (vi) a gas composition or flow rate, (vii) a substrate temperature or composition, (viii) a temperature of a chamber component or wall, and (ix) a magnetic confinement level or magnet position; and
(b) a controller adapted to:
(1) issue an endpoint signal when the process variable is indicative of an endpoint of the process; and
(2) determine if the endpoint signal is true or false by evaluating the process parameter.

16. An apparatus according to claim 15 wherein the controller determines the endpoint signal to be true when the process parameter is a predetermined value or is in a range of predetermined values.

17. An apparatus according to claim 15 wherein the controller evaluates the process parameter to set a fault flag if the process parameter is not a predetermined value or in a range of predetermined values, and determines the endpoint signal to be (i) false if the endpoint signal is issued and the fault flag is set, or (ii) true if the endpoint signal is issued and the fault flag is not set.

18. An apparatus according to claim 15 wherein the detectors monitor a plurality of the process parameters.

19. An apparatus according to claim 18 wherein the detectors monitor at least three process parameters.

20. An apparatus according to claim 15 further comprising a server to receive the detected process variable and process parameter, and wherein the controller is adapted to access the server to retrieve the process variable and process parameter.

21. An apparatus according to claim 20 further comprising a firewall separating the controller from the server.

22. An endpoint detection apparatus for detecting an endpoint of a process performed in a substrate processing chamber with an energized gas, the apparatus comprising:
(a) one or more detectors to detect:
(1) a process variable of the process, the process variable comprising at least one of (i) a radiation emitted by the energized gas, (ii) a radiation reflected from a substrate in the chamber, (ii) a reflected power level of the energized gas, and (iv) a temperature in the chamber, and
(2) a process parameter of the process, the process parameter comprising at least one of (i) a source power, (ii) an RF forward power, reflected power, or match components, (iii) an RF peak-to-peak voltage, current or phase, (iv) a DC bias level, (v) a gas pressure or throttle valve position, (vi) a gas composition or flow rate, (vii) a substrate temperature or composition, (viii) a temperature of a chamber component or wall, and (ix) a magnetic confinement level or magnet position; and
(b) a controller adapted to:
(1) issue an endpoint signal when the process variable is indicative of an endpoint of the process,
(2) evaluate the process parameter to set a fault flag if the process parameter does not correspond to a predetermined value or is in a range of predetermined values, and
(3) determine the endpoint signal to be (i) false if the endpoint signal is issued and the fault flag is set, or (ii) true if the endpoint signal is issued and the fault flag is not set.

23. An apparatus according to claim 22 wherein the detectors monitor a plurality of the process parameters.

24. An apparatus according to claim 23 wherein the detectors monitor at least three process parameters.

25. An apparatus according to claim 22 further comprising a server to receive the detected process variable and process parameter from the detectors, and wherein the controller is adapted to access the server to retrieve the process variable and the process parameter.

26. An endpoint detection apparatus for detecting an endpoint of a process performed in a substrate processing chamber with an energized gas, the apparatus comprising:
(a) one or more detectors to detect:
(1) an intensity of (i) a radiation from the energized gas, or (ii) a radiation reflected from a substrate in the chamber, and
(2) a process parameter of the process performed in the chamber; and
(b) a controller adapted to:
(1) determine if the intensity of the radiation corresponds to a first value or is in a first range of values,
(2) determine if the process parameter is in a second range of values corresponding to a response coefficient in the equation:

$$\frac{\Delta I(\lambda)}{I(\lambda)} = A_R \frac{\Delta R}{R} + A_P \frac{\Delta P}{P} + A_{F1} \frac{\Delta F_1}{F_1} + A_{F2} \frac{\Delta F_2}{F_2} + A_{F3} \frac{\Delta F_3}{F_3},$$

where R is an RF power applied to the energized gas, P is a pressure of the gas in the chamber, F1, F2, and F3 are gas flow rates, and AR, AP, AF1, AF2, and AF3 are their respective response coefficients, and (3) determine if an endpoint of the process is reached when the radiation intensity is the first value or is in the first range of values, and the process condition is in the second range of values.

27. An apparatus according to claim 26 wherein the detectors detect a process parameter comprising at least one of (i) a source power, (ii) an RF forward power, reflected power, or match components, (iii) an RF peak-to-peak voltage, current or phase, (iv) a DC bias level, (v) a gas pressure or throttle valve position, (vi) a gas composition or flow rate, (vii) a substrate temperature or composition, (viii) a temperature of a chamber component or wall, and (ix) a magnetic confinement level or magnet position.

28. An apparatus according to claim 26 wherein the detectors monitor a plurality of the process parameters.

29. An apparatus according to claim 28 wherein the detectors monitor at least three process parameters.

30. An apparatus according to claim 26 further comprising a server to receive the detected radiation intensity and process parameter from the detectors, and wherein the controller is adapted to access the server to retrieve the radiation intensity and the process parameter.

* * * * *